(12) United States Patent
Burton et al.

(10) Patent No.: US 11,835,564 B2
(45) Date of Patent: Dec. 5, 2023

(54) WIRELESS TELECOMMUNICATIONS NETWORK

(71) Applicant: British Telecommunications Public Limited Company, London (GB)

(72) Inventors: Fraser Burton, London (GB); Tim Whitley, London (GB); Marcus Paterson, London (GB); Liam Bussey, London (GB)

(73) Assignee: British Telecommunications Public Limited Company, London (GB)

( * ) Notice: Subject to any disclaimer, the term of this patent is extended or adjusted under 35 U.S.C. 154(b) by 0 days.

(21) Appl. No.: 17/754,871

(22) PCT Filed: Sep. 8, 2020

(86) PCT No.: PCT/EP2020/075070
§ 371 (c)(1),
(2) Date: Apr. 14, 2022

(87) PCT Pub. No.: WO2021/078434
PCT Pub. Date: Apr. 29, 2021

(65) Prior Publication Data
US 2023/0194590 A1      Jun. 22, 2023

(30) Foreign Application Priority Data

Oct. 24, 2019   (EP) ..................................... 19205106
Oct. 24, 2019   (GB) ..................................... 1915420

(51) Int. Cl.
*G01R 29/08* (2006.01)
*G02B 6/02* (2006.01)
(52) U.S. Cl.
CPC ..... *G01R 29/0885* (2013.01); *G02B 6/02328* (2013.01)

(58) Field of Classification Search
CPC ..................... G01R 29/0885; G02B 6/02328
(Continued)

(56) References Cited

U.S. PATENT DOCUMENTS

| 6,826,339 B1 | 11/2004 | Mueller |
| 10,763,966 B1 | 9/2020 | Deb et al. |

(Continued)

FOREIGN PATENT DOCUMENTS

| CN | 1882859 A | 12/2006 |
| CN | 205691490 U | 11/2016 |

(Continued)

OTHER PUBLICATIONS

Yin, Yi, et al. "Catch and release of microwave photon states." Physical review letters 110.10 (2013): 107001. (Year: 2013).*

(Continued)

*Primary Examiner* — Christopher P McAndrew
(74) *Attorney, Agent, or Firm* — Patterson Thuente IP

(57) ABSTRACT

This disclosure provides a waveguide including a sequence of variable transparency segments, wherein each variable transparency segment of the sequence of variable transparency segments is configured to vary its transparency by the electromagnetically Induced Transparency (EIT) effect and further vary its transparency in response to an incident electromagnetic field; and a plurality of separator segments interspersed within the sequence of variable transparency segments so that each variable transparency segment: has a first separation distance from a first other variable transparency segment being a first predetermined number of variable transparency segments preceding or succeeding in the sequence of variable transparency segments, has a second separation distance from a second other variable transparency segment being a second predetermined number of variable transparency segments preceding or succeeding in (Continued)

the sequence of variable transparency segments, and is uniquely identified by a combination of separation distances comprising its first and second separation distances.

20 Claims, 12 Drawing Sheets

(58) Field of Classification Search
USPC .......................................................... 324/629
See application file for complete search history.

(56) References Cited

U.S. PATENT DOCUMENTS

| | | | |
|---|---|---|---|
| 10,979,147 | B2 | 4/2021 | Gordon et al. |
| 11,402,479 | B1 | 8/2022 | Pecen et al. |
| 2008/0278710 | A1 | 11/2008 | Schmidt et al. |
| 2009/0289629 | A1 | 11/2009 | Tuchman |
| 2011/0095755 | A1 | 4/2011 | Maki |
| 2016/0033422 | A1* | 2/2016 | Vaisman ............... G01N 22/00 324/633 |
| 2016/0363617 | A1 | 12/2016 | Anderson et al. |
| 2019/0187198 | A1 | 6/2019 | Anderson et al. |
| 2020/0295838 | A1* | 9/2020 | Gordon ............... H04B 10/548 |
| 2021/0048465 | A1 | 2/2021 | Anderson et al. |
| 2021/0250101 | A1 | 8/2021 | Gordon et al. |
| 2022/0196716 | A1 | 6/2022 | Anderson et al. |

FOREIGN PATENT DOCUMENTS

| | | |
|---|---|---|
| CN | 104714110 B | 9/2017 |
| CN | 107179450 A | 9/2017 |
| CN | 107462849 A | 12/2017 |
| CN | 108152602 A | 6/2018 |
| CN | 106124856 B | 10/2018 |
| CN | 108809341 A | 11/2018 |
| CN | 108927314 A | 12/2018 |
| CN | 109142891 A | 1/2019 |
| CN | 109342830 A | 2/2019 |
| CN | 109905177 A | 6/2019 |
| CN | 107179450 B | 10/2019 |
| CN | 107462849 B | 1/2020 |
| CN | 113504415 A | 10/2021 |
| CN | 113514698 A | 10/2021 |
| EP | 3308146 A1 | 4/2018 |
| GB | 2588754 A | 5/2021 |
| GB | 2597260 A | 1/2022 |
| GB | 2605123 A | 9/2022 |
| GB | 2606167 A | 11/2022 |
| WO | WO-2018103897 A1 | 6/2018 |
| WO | WO-2021078438 A1 | 4/2021 |
| WO | WO-2021243260 A1 | 12/2021 |

OTHER PUBLICATIONS

Anderson D.A., et al., "An Atomic Receiver for AM and FM Radio Communication", Aug. 26, 2018, 6 pages.
Combined Search and Examination Report under sections 17 & 18(3) for Great Britain Application No. 2010995.5, dated Apr. 9, 2021, 12 pages.
Combined Search and Examination Report under Sections 17 and 18(3) for Great Britain Application No. 1915420.2, dated Apr. 22, 2020, 6 pages.
Epple G., et al., "Rydberg Atoms in Hollow-Core Photonic Crystal Fibres", Nature Communications, Jun. 19, 2014, 5 pages.
Extended European Search Report for Application No. 19205106.8, dated Apr. 29, 2020, 6 pages.
Holloway C.L., et al., "A Multiple-Band Rydberg-Atom Based Receiver/Antenna: AM/FM Stereo Reception", National Institute of Standards and Technology (NIST), Boulder, CO 80305, Mar. 2, 2019, 10 pages.
Holloway C.L., et al., "Detecting and Receiving Phase Modulated Signals with a Rydberg Atom-Based Mixer", National Institute of Standards and Technology, Boulder, CO 80305, USA, Mar. 27, 2019, 5 pages.
Holloway C.L., et al., "Development and Applications of a Fiber-Coupled Atom-Based Electric Field Probe", 2018 International Symposium on Electromagnetic Compatibility (EMC Europe), IEEE, Aug. 27-30, 2018, pp. 381-385.
International Search Report and Written Opinion for Application No. PCT/EP2020/075070, dated Dec. 15, 2020, 12 pages.
International Search Report and Written Opinion for Application No. PCT/EP2021/065655, dated Aug. 23, 2021, 15 pages.
Simons M.T., et al., "A Rydberg Atom-Based Mixer: Measuring the Phase of a Radio Frequency Wave", Mar. 9, 2019, 4 pages.
Simons M.T., et al., "Fiber-Coupled Vapor Cell for a Portable Rydberg Atom-Based Radio Frequency Electric Field Sensor", Applied Optics, Jul. 26, 2018, vol. 57 (22), 5 pages.
Song Z., et al., "Rydberg-Atom-Based Digital Communication using a Continuously Tunable Radio-Frequency Carrier", Mar. 18, 2019, vol. 27 (6), 10 pages.
Brodnik G.M., et al., "Widely Tunable Optical Local Oscillator Scheme for RF Photonic Down-Conversion," IEEE Avionics and Vehicle Fiber-Optics and Photonics Conference (AVFOP), Nov. 2019, 2 pages.
Combined Search and Examination Report under Sections 17 and 18(3) for Great Britain Application No. 2211667.7, dated Jan. 24, 2023, 6 pages.
Examination Report for European Application No. 20765052.4, dated Aug. 16, 2022, 4 pages.
Extended European Search Report for Application No. 22189677.2, dated Feb. 7, 2023, 25 pages.
Extended European Search Report for Application No. 22206146.7, dated Apr. 18, 2023, 7 pages.
International Preliminary Report on Patentability for Application No. PCT/EP2021/065655, dated Jul. 29, 2022, 15 pages.
International Preliminary Report on Patentability for Application No. PCT/EP2020/075070, dated May 5, 2022, 8 pages.
International Search Report and Written Opinion for Application No. PCT/EP2022/0053845, dated May 16, 2022, 16 pages.
Kumar S., et al., "Atom-Based Sensing of Weak Radio Frequency Electric Fields Using Homodyne Readout," Scientific Reports, Feb. 20, 2017, vol. 7 (42981), retrieved from the internet URL: https://www.nature.com/articles/srep42981.pdf, 10 pages.
Ma L., et al., "Paschen-Back Effect and Rydberg-State Diamagnetism In Vapor-Cell Electromagnetically Induced Transparency," arxiv.org, Atomic Physics, Feb. 22, 2017, 6 pages.
Meyer D.H., et al., "Assessment of Rydberg Atoms for Wideband Electric Field Sensing," arxiv.org, Journal of Physics B: Atomic, Molecular and Optical Physics, Jan. 13, 2020, 16 pages.
Office action for Chinese Application No. 202080066526.3, dated Jul. 7, 2022, 10 pages.
Search Report under Section 17 for Great Britain Application No. 2202067.1, dated Jul. 13, 2022, 4 pages.
Search Report under Section 17 for Great Britain Application No. 2216601.1, dated May 2, 2023, 4 pages.

* cited by examiner

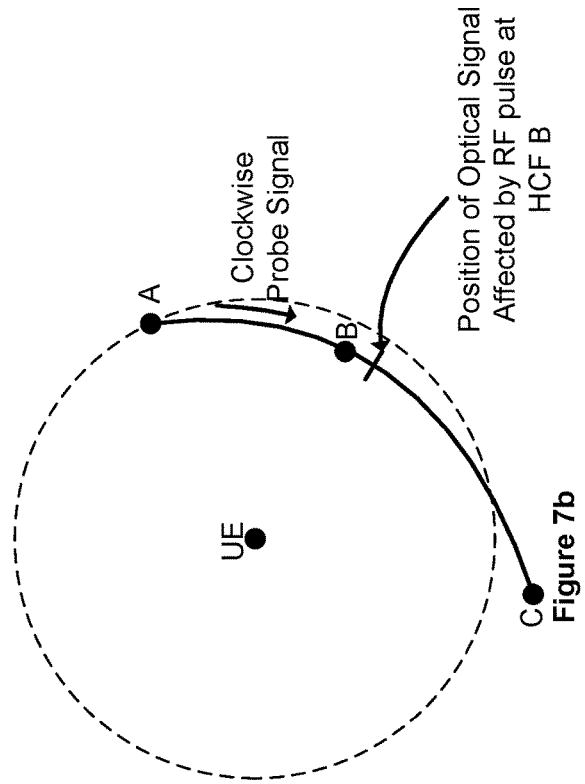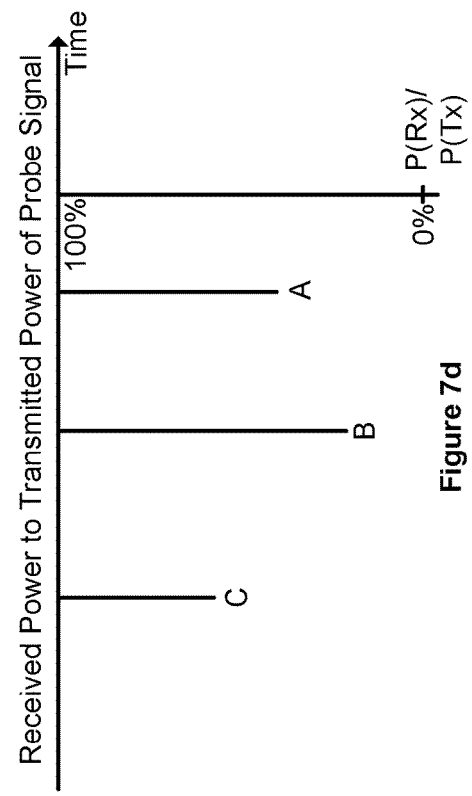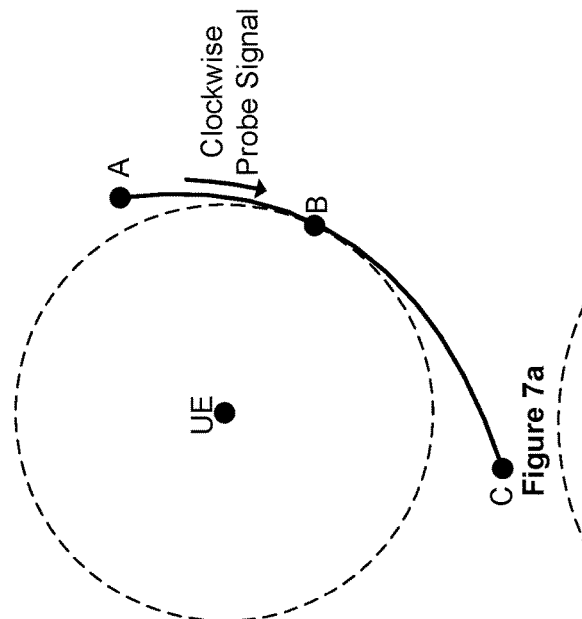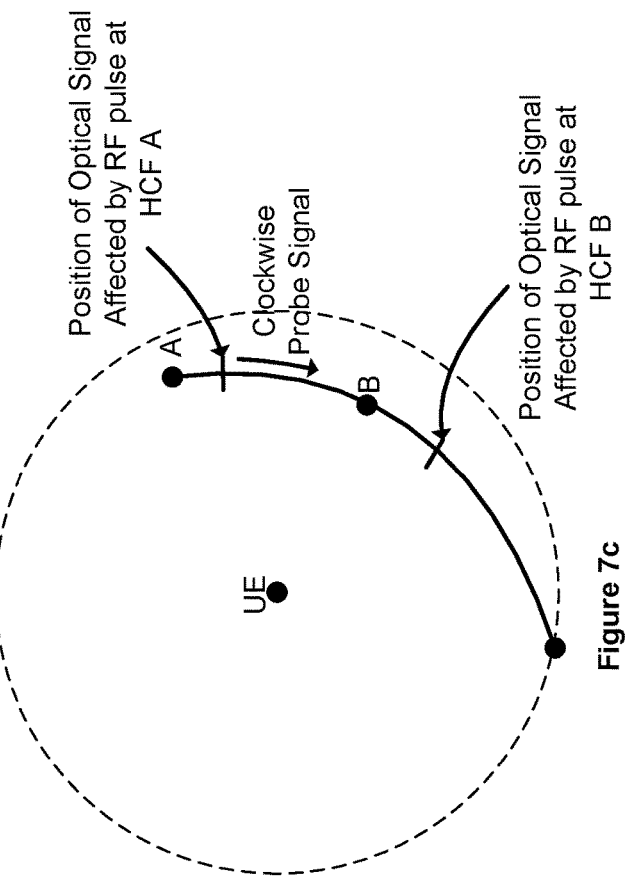

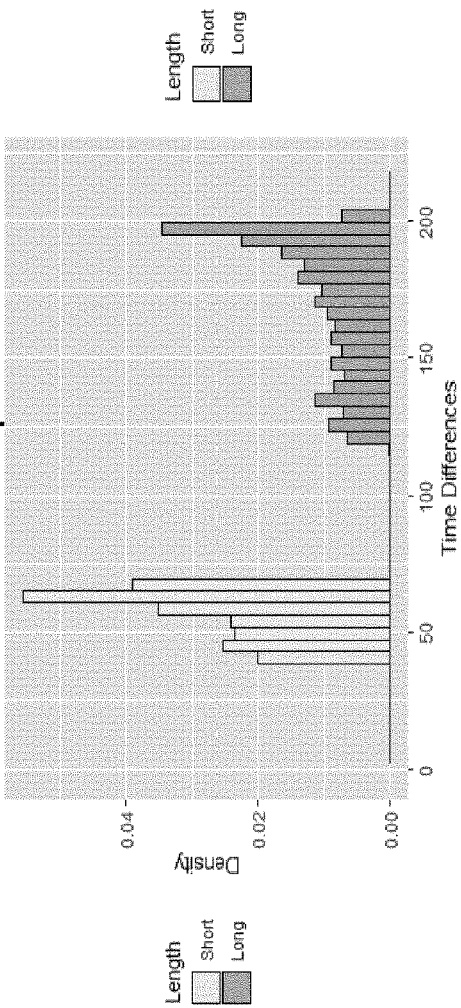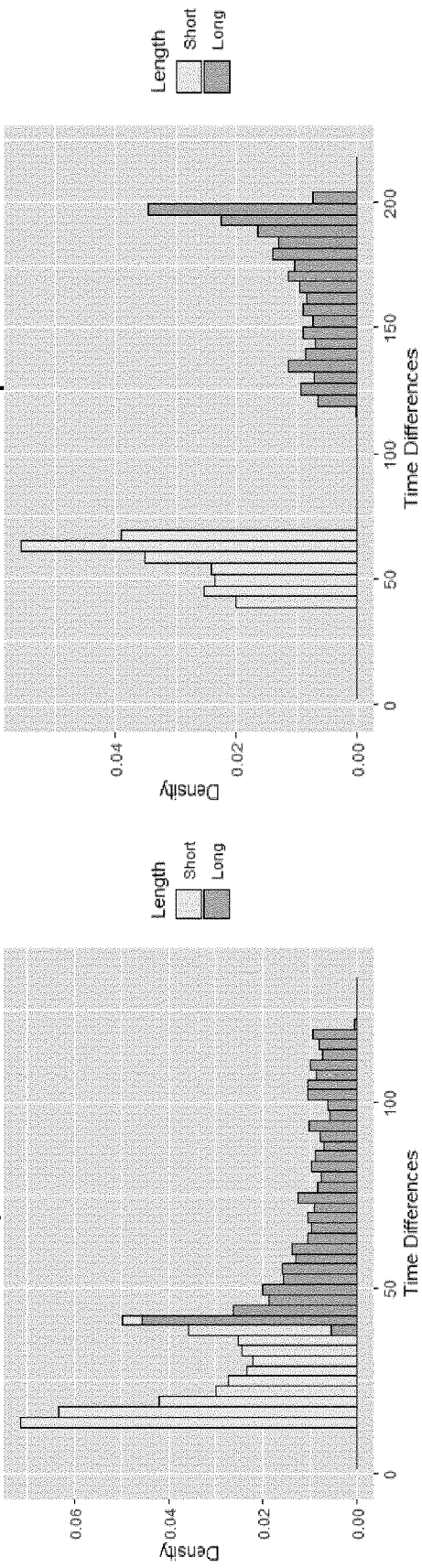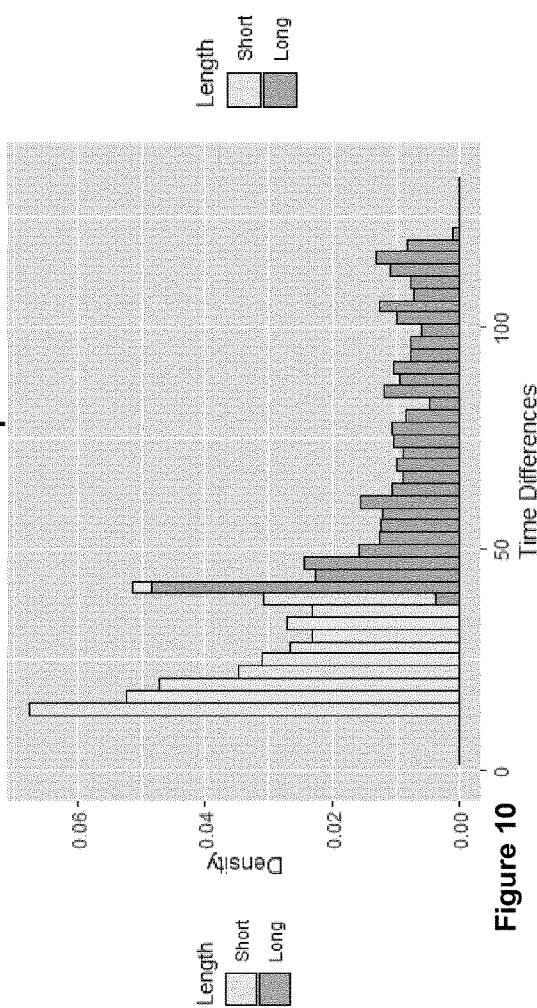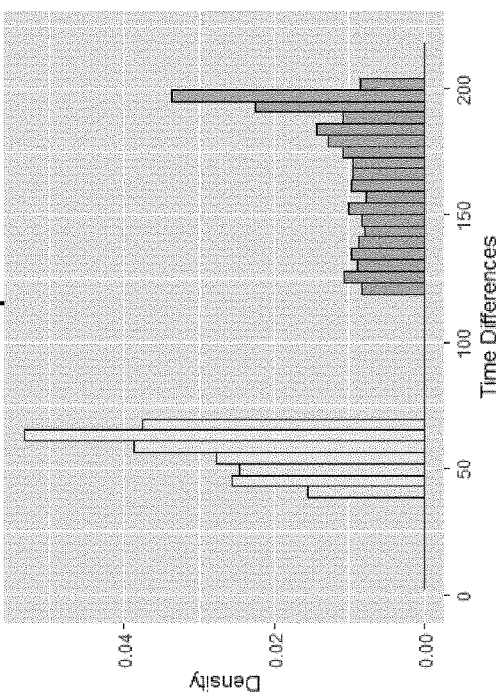
Figure 10

WIRELESS TELECOMMUNICATIONS NETWORK

PRIORITY CLAIM

The present application is a National Phase entry of PCT Application No. PCT/EP2020/075070, filed Sep. 8, 2020, which claims priority from EP Patent Application No. 19205106.8, filed Oct. 24, 2019 and GB Patent Application No. 1915420.2, filed Oct. 24, 2019, each of which is hereby fully incorporated herein by reference.

TECHNICAL FIELD

The present disclosure relates to a wireless telecommunications network.

BACKGROUND

In wireless telecommunications, a wireless signal is transmitted at a particular power level and its signal strength decreases with distance from the transmitter based on the path loss of the transmission environment. The wireless signal cannot be detected once its signal strength is no longer detectable above a background noise level at a receiver. Accordingly, the wireless signal has a maximum range defined by its transmit power, the path loss of its transmission environment and the background noise level.

In cellular telecommunications networks, wireless signals are transmitted between base stations and User Equipment (UE). An example cellular telecommunications network is shown in FIG. 1, illustrating a base station and a UE and their respective coverage areas. In this scenario, the UE cannot receive wireless signals from the base station and, in the absence of alternatives, cannot receive voice or data service. Furthermore, as the base station is outside the UE's coverage area, it cannot receive wireless signals from the UE. The skilled person will understand that this problem is experienced in other forms of wireless telecommunications, such as in Wireless Local Area Networks (WLANs), where two devices of the network cannot communicate as they are located outside the other device's respective coverage area.

SUMMARY

According to a first aspect of the disclosure, there is provided a waveguide comprising: a sequence of variable transparency segments, wherein each variable transparency segment of the sequence of variable transparency segments is configured to vary its transparency by the Electromagnetically Induced Transparency (EIT) effect and further vary its transparency in response to an incident electromagnetic field; and a plurality of separator segments interspersed within the sequence of variable transparency segments so that each variable transparency segment: has a first separation distance from a first other variable transparency segment being a first predetermined number of variable transparency segments preceding or succeeding in the sequence of variable transparency segments, has a second separation distance from a second other variable transparency segment being a second predetermined number of variable transparency segments preceding or succeeding in the sequence of variable transparency segments, and is uniquely identified by a combination of separation distances comprising its first and second separation distances.

By being a first predetermined number of variable transparency segments preceding or succeeding in the sequence of variable transparency segments, the first other variable transparency segment may be at a (n+x)th position in the sequence of variable transparency segments (n representing the position in the sequence of a particular variable transparency segment and x being a positive or negative integer which is constant for all values of n). Similarly, by being a second predetermined number of variable transparency segments preceding or succeeding in the sequence of variable transparency segments, the second other variable transparency segment may be at a (n+y)th position in the sequence of variable transparency segments (n representing the position in the sequence of the particular variable transparency segment and y being a positive or negative integer which is constant for all values of n). Thus, the present disclosure may further be defined as: a waveguide comprising: a sequence of N variable transparency segments, wherein each variable transparency segment of the sequence of variable transparency segments is configured to vary its transparency by the Electromagnetically Induced Transparency (EIT) effect and further vary its transparency in response to an incident electromagnetic field; and a plurality of separator segments interspersed within the sequence of variable transparency segments so that each variable transparency segment, indexed by n: has a first separation distance from a first other variable transparency segment at a (n+x)th position in the sequence of variable transparency segments, has a second separation distance from a second other variable transparency segment at a (n+y)th position in the sequence of variable transparency segments, and is uniquely identified by a combination of separation distances comprising its first and second separation distances; wherein x and y are positive or negative integers which are constant for all values of n.

The first other variable transparency segment may be preceding in the sequence of variable transparency segments and the second other variable transparency segment may be succeeding in the sequence variable transparency segments. Furthermore, the first other variable transparency segment may be immediately preceding in the sequence of variable transparency segments and the second other variable transparency segment may be immediately succeeding in the sequence variable transparency segments.

The first and/or second separation distance may be a classification in either a first or second distance category.

Each variable transparency segment may include a metal vapor. The metal vapor may be of an alkali metal, such as Rubidium, Cesium or Strontium.

According to a second aspect of the disclosure, there is provided a system having a first waveguide of the first aspect of the disclosure and a second waveguide of the first aspect of the disclosure, wherein corresponding variable transparency segments of the sequence of variable transparency segments of the first and second waveguides are collocated such that the separation distance between each pair of variable transparency segments in the first waveguide is the same as the separation distance between each corresponding pair of variable transparency segments in the second waveguide.

According to a third aspect of the disclosure, there is provided an electromagnetic field detector comprising: a first optical transmitter, a first optical receiver, and a first waveguide of the first aspect of the disclosure, wherein: the first optical transmitter and first optical receiver terminate opposing ends of the first waveguide, and the first optical transmitter is configured to: transmit a probe signal to the first optical receiver via the first waveguide at a probe frequency, wherein the probe frequency is set to excite electrons of each variable transparency segment of the first waveguide from a first state to a second state, and transmit a coupling signal via the first waveguide at a coupling frequency, wherein the coupling frequency is set to excite electrons of each variable transparency segment of the first waveguide to a predetermined state so as to vary the transparency of each variable transparency segment to the probe signal by the Electromagnetic Induced Transparency (EIT) effect and so that an electromagnetic field incident at each variable transparency segment of the first waveguide further varies the transparency of the probe signal at that variable transparency segment so as to cause a detectable change in power of the probe signal at the first optical receiver.

The detector may further comprise a second optical transmitter; a second optical receiver; and a second waveguide of the first aspect of the invention, wherein: corresponding variable transparency segments of the sequence of variable transparency segments of the first and second waveguides are collocated such that the separation distance between each pair of variable transparency segments in the first waveguide is the same as the separation distance between each corresponding pair of variable transparency segments in the second waveguide, the second optical transmitter and second optical receiver terminate opposing ends of the second waveguide, and the second optical transmitter is configured to: transmit a second probe signal via the second waveguide at the probe frequency, and transmit a second coupling signal via the second waveguide at the coupling frequency so as to vary the transparency of each variable transparency segment of the second waveguide to the probe signal by the EIT effect and so that an electromagnetic field incident at each variable transparency segment of the second waveguide further varies the transparency of the probe signal at that variable transparency segment so as to cause a detectable change in power of the probe signal at the second optical receiver.

The first optical transmitter may also be the second optical transmitter and the first optical receiver may also be the second optical receiver.

According to a fourth aspect of the disclosure, there is provided a method of operating an electromagnetic field detector, the detector comprising a first waveguide of the first aspect of the invention, the method comprising: transmitting a first probe signal along the first waveguide at a probe frequency and at a first transmission power value, wherein the probe frequency is set to excite electrons of each variable transparency segment of the first waveguide from a first state to a second state; transmitting a coupling signal along the first waveguide at a coupling frequency, wherein the coupling frequency is set to excite electrons of each variable transparency segment of the first waveguide to a predetermined state so as to vary the transparency of each variable transparency segment of the first waveguide to the first probe signal by the Electromagnetic Induced Transparency (EIT) effect and so that an electromagnetic field incident at each variable transparency segment of the first waveguide further varies the transparency of the first probe signal at that variable transparency segment so as to cause a detectable change in power of the first probe signal; monitoring the first probe signal; detecting, within the monitored first probe signal, a first plurality of attenuation events, wherein each attenuation event of the first plurality of attenuation events is identifiable as a reduction in the power of the monitored first probe signal relative to the first transmission power value and each attenuation event of the first plurality of attenuation events is associated with a reception time; correlating the reception times of each attenuation event of the first plurality of attenuation events with the unique combination of separation distances to associate each of the first plurality of attenuation events with a variable transparency segment of the first waveguide; for a subset of the associated variable transparency segments, determining a distance between each associated variable transparency segment and a transmitter of the electromagnetic field; and determining a location of the transmitter based on the determined distances between each associated variable transparency segment and the transmitter.

The electromagnetic field detector may further comprise a second waveguide of the first aspect of the disclosure, wherein corresponding variable transparency segments of the sequence of variable transparency segments of the first and second waveguides are collocated such that the separation distance between each pair of variable transparency segments in the first waveguide is the same as the separation distance between each corresponding pair of variable transparency segments in the second waveguide, and the method may further comprise: transmitting a second probe signal along the second waveguide at the probe frequency and at a second transmission power value; transmitting a second coupling signal along the second waveguide at the coupling frequency, monitoring the second probe signal; and detecting, within the monitored second probe signal, a second plurality of attenuation events, wherein each attenuation event of the second plurality of attenuation events is identifiable as a reduction in the power of the monitored second probe signal relative to the second transmission power value and each attenuation event of the second plurality of attenuation events is associated with a reception time, wherein the correlation includes correlating the reception times of attenuation events from either the first or second plurality of attenuation events with the unique combination of separation distances to associate each of the first or second plurality of attenuation events with a variable transparency segment of the first or second waveguide.

The first and second probe signal may be transmitted in opposing directions.

The method may further comprise: transmitting a first calibration probe signal along the first waveguide at the probe frequency and at a first calibration transmission power value; transmitting a second calibration probe signal along the second waveguide at the probe frequency and at a second calibration transmission power value; transmitting a first calibration coupling signal along the first waveguide at the coupling frequency; transmitting a second calibration coupling signal along the second waveguide at the coupling frequency, transmitting a plurality of calibration electromagnetic waves, each from a known location, wherein each calibration electromagnetic wave of the plurality of calibration electromagnetic waves incident at each variable transparency segment of the first waveguide and second waveguide varies the transparency of the calibration probe signal at that variable transparency segment so as to cause a detectable change in the power of the calibration probe signal; monitoring the first and second calibration probe signals; detecting, within the monitored first and second calibration probe signals, a first plurality of calibration attenuation events and a second plurality of calibration attenuation events respectively, wherein each calibration attenuation event of the first plurality of calibration attenuation events is identifiable as a reduction in the power of the monitored first calibration probe signal relative to the first calibration transmission power value and each calibration attenuation event of the first plurality of calibration attenuation events is associated with a reception time, and each calibration attenuation event of the second plurality of calibration attenuation events is identifiable as a reduction in the power of the monitored second calibration probe signal relative to the second calibration transmission power value and each calibration attenuation event of the second plurality of calibration attenuation events is associated with a reception time; and determining whether an attenuation event of the first plurality of attenuation events of the first monitored probe signal or the second plurality of attenuation events of the second monitored probe signal should be used in the correlation based on the reception times of the first plurality of calibration attenuation events of the monitored first calibration probe signal and the reception times of the second plurality of calibration attenuation events of the monitored second calibration probe signal.

The electromagnetic field may be a Radio Frequency (RF) field.

According to a fifth aspect of the disclosure, there is provided a computer program product comprising instructions which, when the program is executed by a computer, cause the computer to carry out the method of the fourth aspect of the disclosure. The computer program may be stored on a computer-readable data carrier.

BRIEF DESCRIPTION OF THE FIGURES

In order that the present disclosure may be better understood, embodiments thereof will now be described, by way of example only, with reference to the accompanying drawings in which:

FIGS. 7a, 7b and 7c are schematic diagrams illustrating an RF pulse affecting three Hollow Core Fibers (HCFs) of the RF detector at first, second and third time instances respectively.

FIG. 7d is a graph illustrating the ratio of the received power to the transmitted power of a probe signal of the RF detector as affected in the scenario of FIGS. 7a to 7c.

FIG. 10 includes four histograms illustrating the frequency of time differences between adjacent attenuation events for the first optical fiber and second optical fiber for both downstream and upstream attenuation events.

DETAILED DESCRIPTION OF EMBODIMENTS

Figure 1:
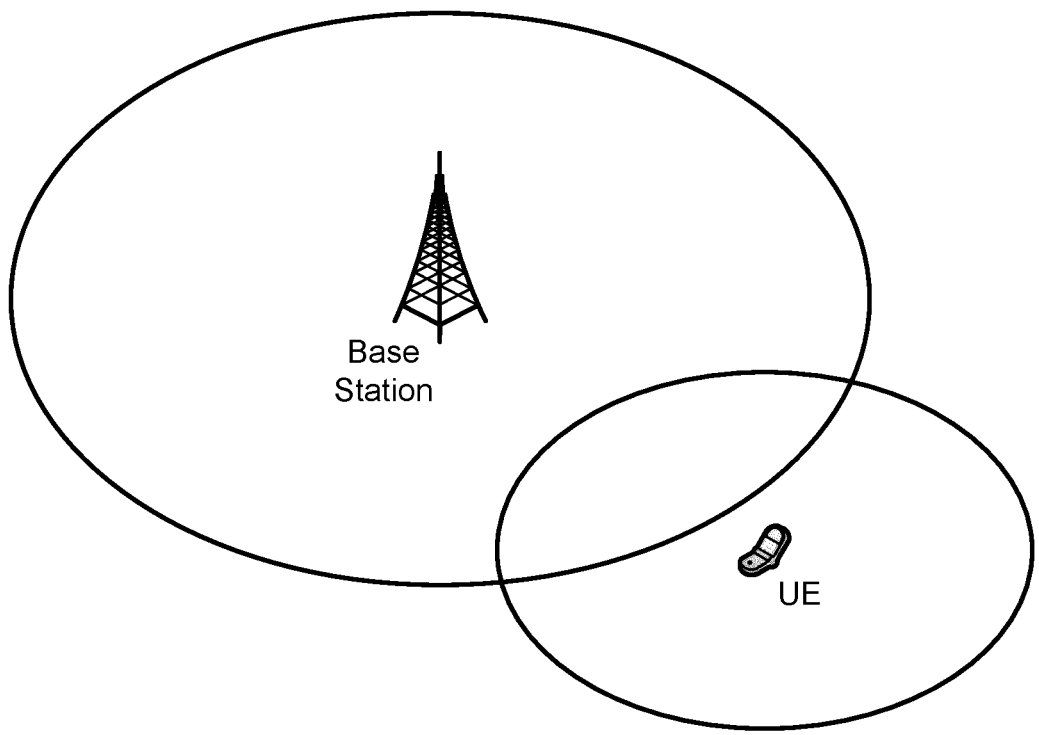
FIG. 1 is a schematic diagram of a conventional cellular telecommunications network.
Figure 2:
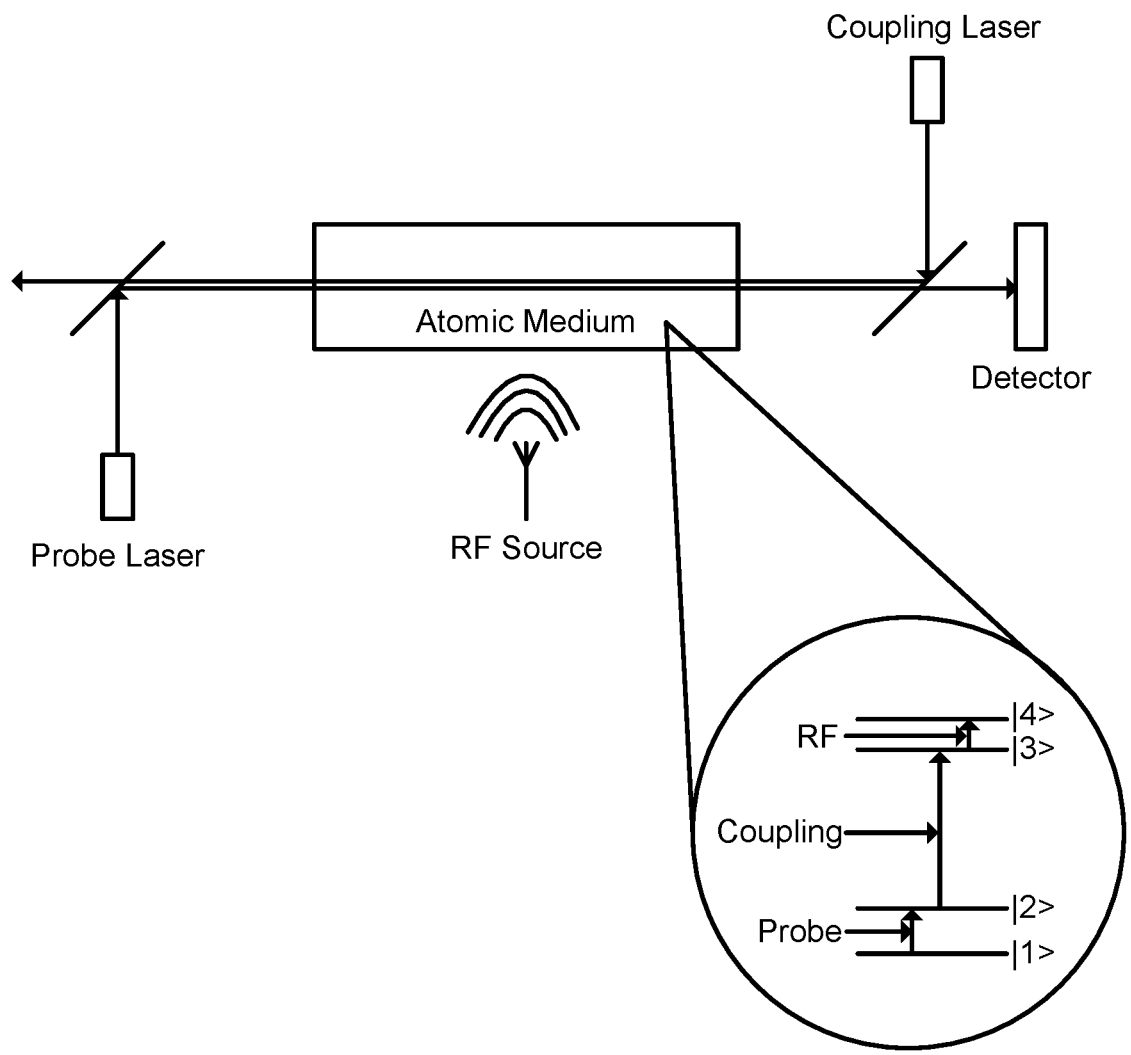
FIG. 2 is a schematic diagram illustrating a Rydberg atom based Radio Frequency (RF) detector.

A first embodiment of a Radio Frequency (RF) detector of the present disclosure will now be described with reference to FIGS. 2 to 4. This first embodiment utilizes an RF detector based on a Rydberg atom (sometimes referred to as an "atomic receiver"). An overview of the Rydberg atom and a Rydberg atom based RF detector is presented below.

A Rydberg atom is an atom with one or more electrons excited to a very high principal quantum number. These Rydberg atoms have several useful properties, such as very large dipole moments and long decay periods. These properties can be exploited to create an RF detector that may receive and demodulate RF fields over very large frequency ranges (e.g. from hundreds of MHz to 1 THz).

The principle of operation of a Rydberg atom based RF detector will now be described with reference to FIG. 2. An atomic medium is provided which, in this example, is a glass cavity filled with a low density vapor of alkali metal atoms (such as Rubidium-85). Each Rubidium-85 atom has a number of electron states, including the ground state and a plurality of excited states. The outer electron of the Rubidium-85 atom may be excited (e.g. by absorbing a photon of a particular wavelength) from the ground state to an excited state. The electron may then decay from the excited state to a lower excited state (that is, an excited state at a lower energy level) or to the ground state. However, some of these transitions are not allowed as they are dipole forbidden.

In the Rydberg atom based RF detector, a first laser (known as a "probe" laser) is passed through the atomic medium at a first wavelength which corresponds to the energy required to elevate the Rubidium-85 atom's outer electron from its ground state ($|1\rangle$) to a first excited state ($|2\rangle$). A second laser (known as a "coupling" laser) is also passed through the atomic medium in an opposing direction at a relatively large power level (compared to the probe laser) and at a second wavelength which corresponds to the energy required to elevate the Rubidium-85 atom's outer electron from the first excited state ($|2\rangle$) to a Rydberg state ($|3\rangle$). The transition from the Rydberg state ($|3\rangle$) to the ground state ($|1\rangle$) is forbidden so that the ground state becomes depopulated and so fewer atoms can absorb the probe laser operating at the first wavelength. Accordingly, the atomic medium becomes more transparent to the probe laser so that it is observable at an optical detector. This phenomenon is known as Electromagnetically Induced Transparency (EIT) and the received signal is known as the EIT signal. Specifically, the above description is of a ladder scheme, but the skilled person would understand that EIT may be realized through alternative electron transitions, such as the Vee and Lambda schemes.

Once the atomic medium has become transparent to the probe laser, then a further physical effect can be exploited to detect RF electric fields. As the Rubidium-85 atom's outer electron is much further away from the atomic nucleus when in the Rydberg state compared to the ground state, a large dipole moment is created and it becomes responsive to incident RF fields. An incident RF field causes a further transition of an electron from the Rydberg state ($|3\rangle$) to an adjacent Rydberg state ($|4\rangle$) when the photon energy of the RF field matches the energy required for the electron to transition from the Rydberg state to the adjacent Rydberg state. If the transition from the adjacent Rydberg state (|4>) to the ground state (|1>) is not forbidden, then electrons may subsequently drop to the ground state so that the atomic medium becomes less transparent to the probe laser, causing a drop in amplitude of the EIT signal. This drop in amplitude of the EIT signal is directly proportional to the incident RF field's amplitude, thus creating a Rydberg atom based RF detector for Amplitude Modulated (AM) signals. A more detailed explanation of this effect (in particular the splitting of the optical transparency region due to the presence of the incident RF field and its correlation with the field's amplitude, can be found in article, "A Multiple-Band Rydberg atom Based Receiver/Antenna: AM/FM Stereo Reception", Holloway et al., National Institute of Standards and Technology).

Furthermore, a Rydberg atom based RF detector for Frequency Modulated (FM) signals works in a similar manner. That is, when the frequency of the RF field changes (or "detunes") from the frequency required for the transition between the Rydberg state and the adjacent Rydberg state, the EIT signal splits into two non-symmetrical peaks. The separation of the two peaks increases with RF detuning. By locking the probe laser and coupling laser to particular frequencies, then the optical detector output is directly correlated to the FM RF field.

Rydberg atom based RF detectors may also be used to detect phase modulated RF fields, such as those of Binary Phase-Shift Keying (BPSK), Quadrature Phase-Shift Keying (QPSK), and Quadrature Amplitude Modulation (QAM) signals (used in many wireless and cellular communications protocols). In these modulation schemes, data is transmitted by modulating the phase of a carrier. To detect the carrier's phase, a reference RF field being on-resonance with the transition to the Rydberg state is applied to the atomic medium, which acts as a local oscillator. The difference frequency (between those of the carrier and the reference RF field), or "intermediate frequency", is detected and the phase of the intermediate frequency signal corresponds directly to the relative phase between the local oscillator and the incident RF field.

Regardless of the modulation scheme used (amplitude, frequency or phase), the Rydberg atom based RF detector may be configured to detect RF fields of a specific frequency by selecting a particular second wavelength of the coupling laser so that the electrons of the atomic medium are elevated to a particular Rydberg state. This Rydberg state is selected so that photons at the specific frequency to be detected will elevate electrons from this Rydberg state to its adjacent Rydberg state, thus creating a detectable change in the EIT signal that may be observed at the optical detector.

Figure 3:
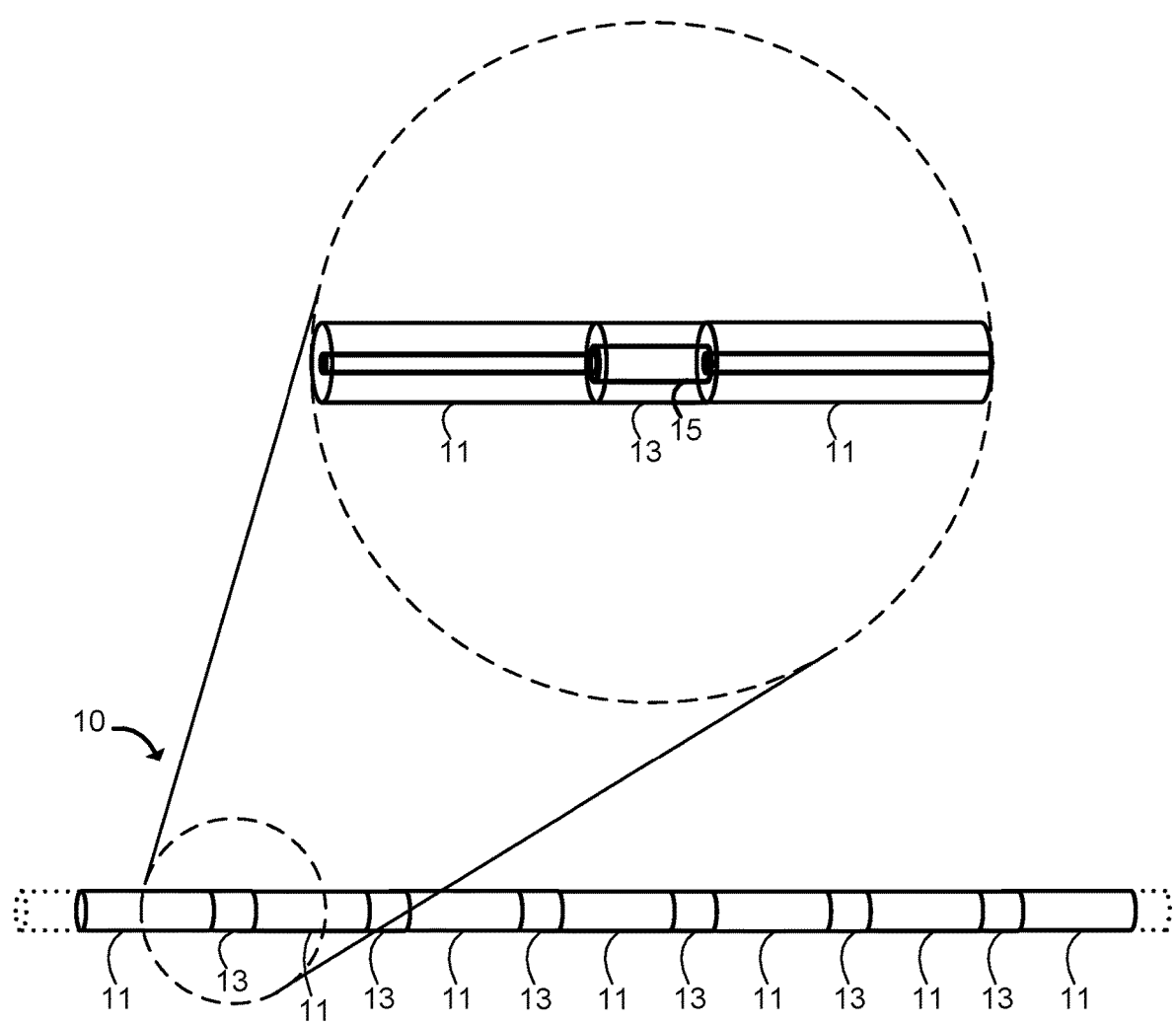
FIG. 3 is a schematic diagram illustrating an optical fiber of a first embodiment of the present disclosure.

FIG. 3 illustrates a first optical fiber 10 of the Rydberg atom based RF detector 1 of this first embodiment. The first optical fiber 10 is a composite optical fiber having alternating segments of Single Mode Fiber (SMF) 11 and Hollow Core Fiber (HCF) 13. In this embodiment, the first optical fiber 10 is around 1 kilometer in length and is constructed of 64 HCF segments, each around 2 centimeters long. Each HCF segment 13 includes an optical cavity 15 containing a vapor of alkali metal (in this example, Rubidium-85).

In this embodiment, the length of each SMF segment (or in other words, the separation distance of a pair of HCF segments either side of the SMF segment) is classified as either 'short' or 'long', in which a short classification is below a classification threshold and a long classification is above the classification threshold. The short SMF segments may be of any length (and may all be the same length) so long as they are below the classification threshold. Similarly, the long SMF segments may be of any length (and may all be the same length) so long as they are above the classification threshold. This will be discussed in more detail in the description of the first embodiment of the method of the present disclosure, below.

Figure 4:
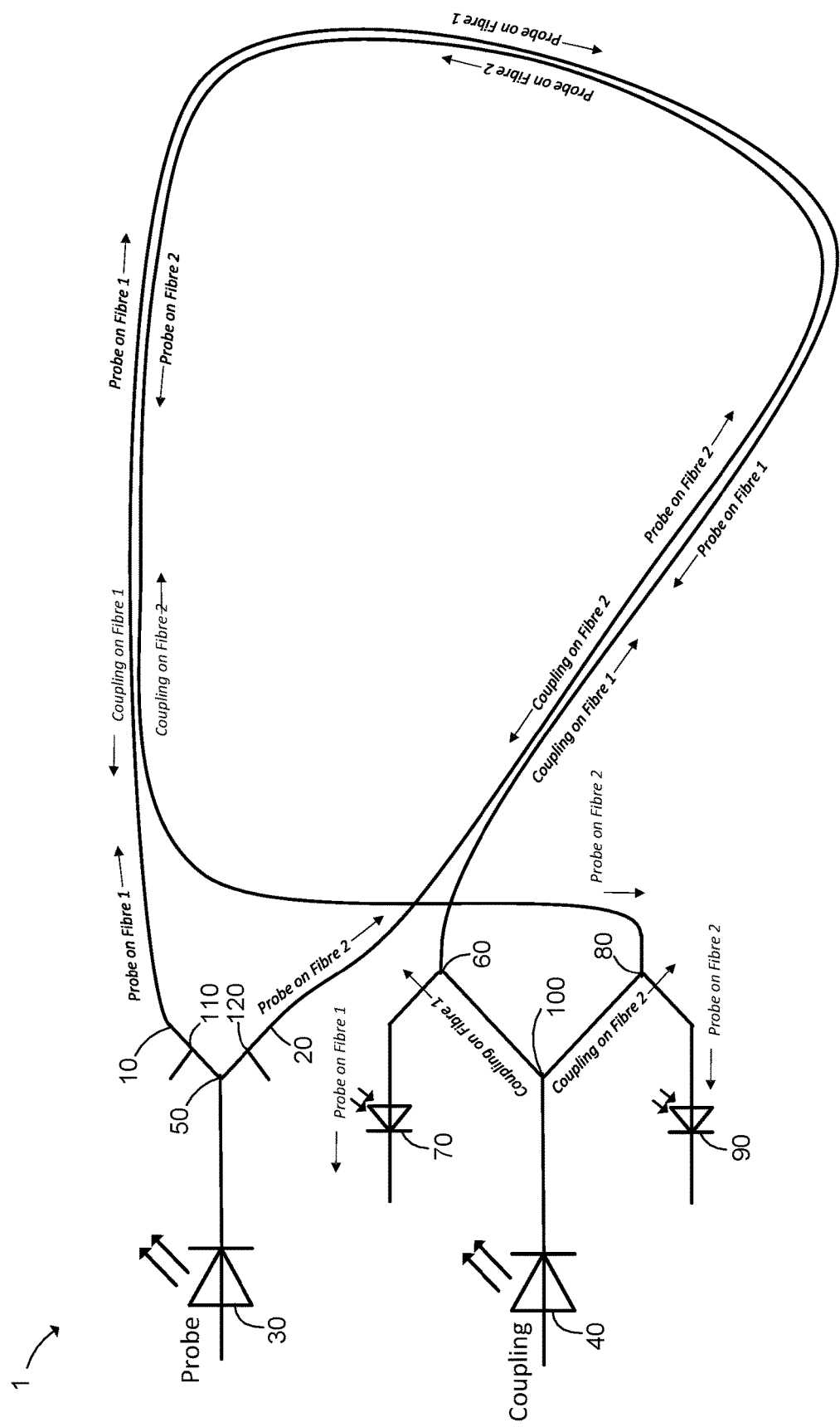
FIG. 4 is a schematic diagram of an RF detector including the optical fiber of FIG. 1.

FIG. 4 illustrates the Rydberg atom based RF detector 1 of this first embodiment, having a first optical fiber 10, a second optical fiber 20 (in this example, identical to the first optical fiber 10), a probe laser 30, and a coupling laser 40. The probe laser 30 is configured to transmit a probe signal, which is split at a first optical splitter 50 coupled to both the first and second optical fiber 10, 20 so that the probe signal passes through both the first and second optical fiber 10, 20. The probe signal propagating on the first optical fiber 10 is directed by a second optical splitter 60 towards a first photodetector 70. The probe signal propagating on the second optical fiber 20 is directed by a third optical splitter 80 towards a second photodetector 90.

The coupling laser 40 is configured to transmit a coupling signal, which is split at a fourth optical splitter 100 coupled to both the first and second optical fiber 10, 20 so that the coupling signal passes through both the first and second optical fiber 10, 20 (in an opposing direction to the probe signal). The coupling signal is split by fifth and sixth optical splitters 110, 120 towards respective non-reflecting terminations.

In this embodiment, the probe signal is on-resonance with the transition of an electron of a Rubidium-85 atom within each HCF core of the first and second optical fibers 10, 20 from a ground state to a first excited state. Furthermore, the coupling signal is on-resonance with the transition of an electron of a Rubidium-85 atom within each HCF core of the first and second optical fibers 10, 20 from the first excited state to a predetermined Rydberg state. In this configuration, as described above, the Rydberg atom based RF detector 1 experiences the EIT effect and the probe signal will pass through both the first and second optical fibers 10, 20 (in other words, the first and second optical fibers 10, 20 are transparent to the probe signal). In this example, it is assumed that there are no other sources of signal attenuation, such that the Rydberg atom based RF detector is fully transparent to the probe signal. The skilled person will understand that to achieve the EIT effect along the whole length of the first and second optical fibers 10, 20 then the density of the vapor in the HCF segments, the number of HCF segments, and the power of the coupling laser must be selected so that the EIT effect is experienced in all HCF segments. That is, the coupling signal will be partially attenuated by each HCF segment in each of the first and second optical fibers 10, 20, so the coupling laser must transmit at a power so that (for a given number of HCF segments and given density of vapor in the HCF segments), the coupling signal is of sufficient power to elevate the electrons in the final HCF segment to the Rydberg state, thus fully depopulating the ground state in the final HCF segment and causing the final HCF segment to be fully transparent to the probe signal.

As discussed above, the Rydberg state may be selected by the precise choice of coupling frequency so that an incident RF field of a specific frequency may be detected by the first and second photodetectors 70, 90. For example, by using a coupling signal having a wavelength of 479.428 nm, the electron may be elevated to the 84th Rydberg state. An incident RF field having a frequency of 3.460 GHz would elevate the electron from this 84th Rydberg state to the adjacent 85th Rydberg state, so that the incident RF field at any one of the HCF segments of the first or second optical fiber 10, 20 would cause a change in transparency of the probe signal in the HCF segment, detectable at the respective photodetector 70, 90.

Figure 6:
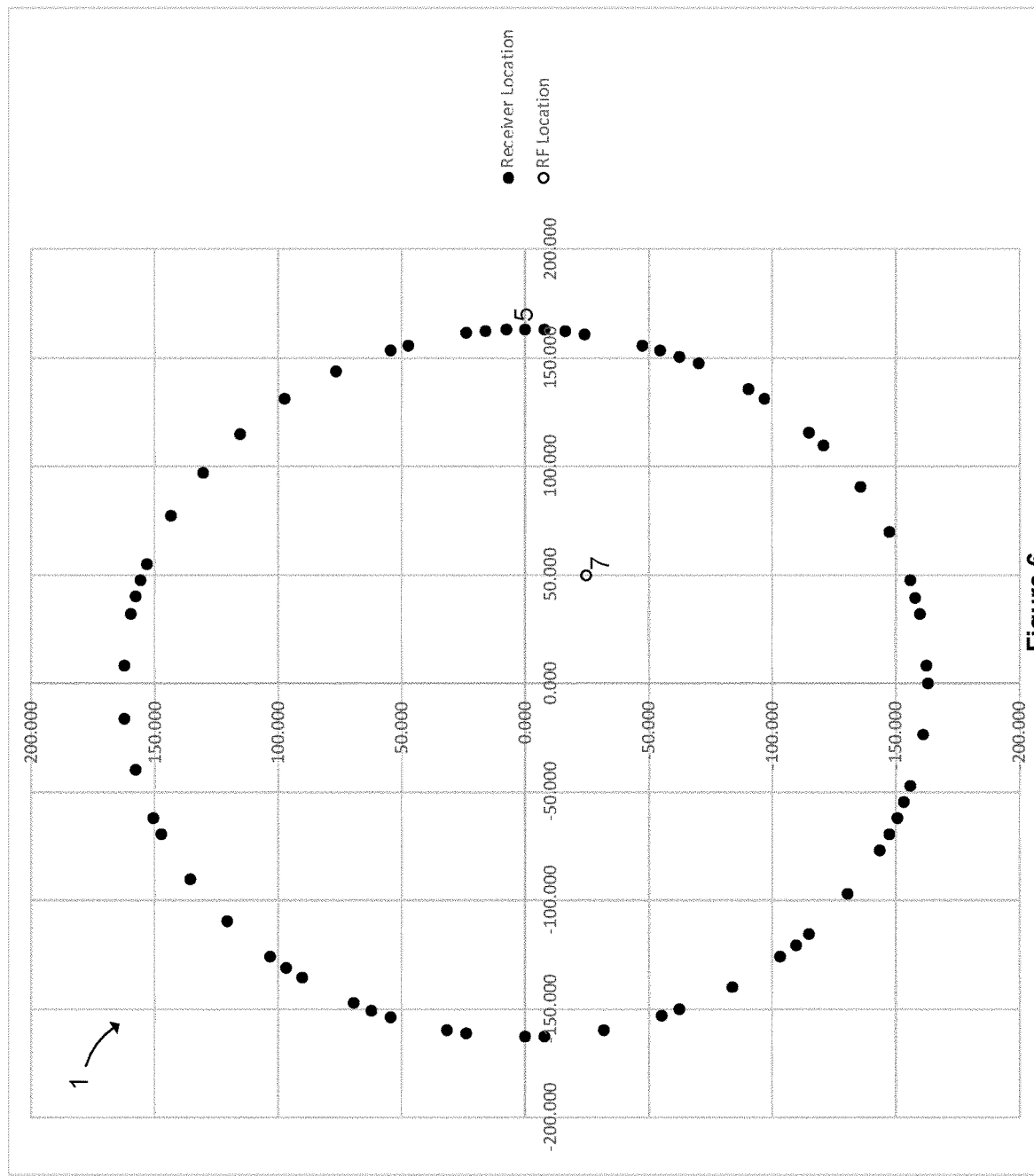
FIG. 6 is a graph illustrating relative positions of various components of the RF detector of FIG. 4 in the method of FIG. 5.

A first embodiment of a method of the present disclosure will now be described. FIG. 6 illustrates the base station 5, UE 7 and Rydberg atom based RF detector 1 (including all 64 constituent HCF segments), in which the relative positions are illustrated on a graph. In this embodiment, for ease of explanation, the first and second optical fibers 10, 20 of the Rydberg atom based RF detector 1 extend in a circle from the base station 5 (so that the center of the first and second optical fibers 10, 20 correlate to the origin of the graph, and the base station is positioned at x=162.75, y=0 on the graph), and the base station 5 includes the probe laser 30, coupling laser 40, first photodetector 70 and second photodetector 90. The position of each HCF segment of the first and second optical fibers 10, 20 (which are collocated) are known. These may be determined, for example, during a calibration phase in which the Global Navigation Satellite System (GNSS) coordinates are obtained at the position of each HCF segment.

It is noted that the UE 7 is outside the base station's coverage area and the base station 5 is outside the UE's coverage area, so that they cannot communicate via wireless transmissions.

In this embodiment, the base station 5 and UE 7 are configured for communications according to the 5G cellular telecommunications protocol, as standardized by the 3rd Generation Partnership Project (3GPP). The base station 5 and UE 7 therefore communicate using 10 ms long radio frames.

Figure 5:
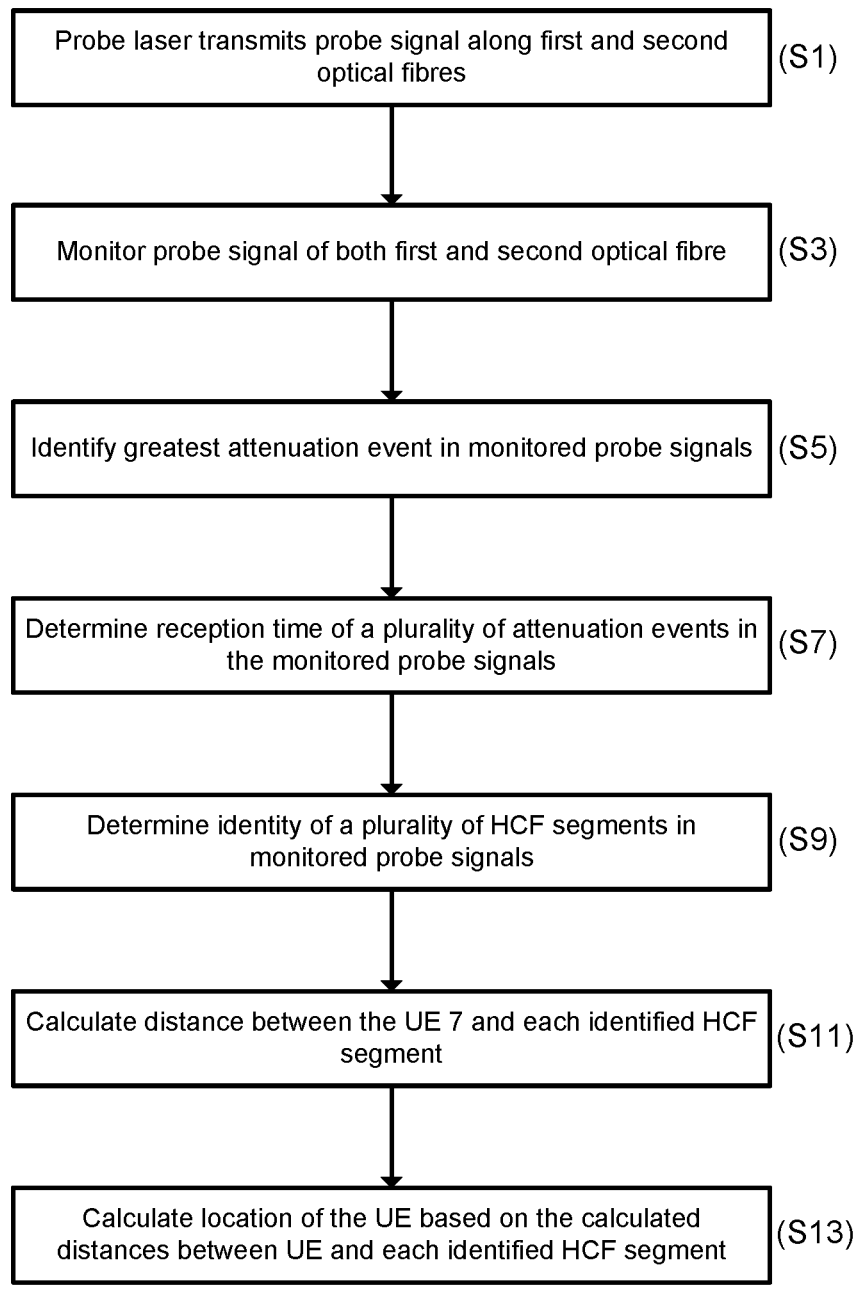
FIG. 5 is a flow diagram illustrating a location determination technique of a first embodiment of a method of the present disclosure.

In S1 of this embodiment (see FIG. 5), the probe laser transmits an amplitude modulated probe signal that repeats every 10 ms, so as to match the radio frame length of an RF signal transmitted by the base station 5 or UE 7, and has a 64-step saw-tooth profile, so that the number of distinct amplitude steps match the number of HCF segments in both the first and second optical fiber 10, 20. The probe signal is transmitted in a first direction on the first optical fiber 10 (in this example, clockwise) whilst the probe signal is transmitted in a second, opposing, direction on the second optical fiber 20 (in this example, counter-clockwise).

In the absence of an incident RF field at the specific frequency to be detected (3. 460 GHz in this example), then the probe signal will pass through both the first and second optical fiber 10, 20 without any attenuation (as all HCF segments of both the first and second optical fiber 10, 20 are fully transparent to the probe signal in the absence of the incident RF field) and are received at the first and second photodetector 70, 90. The received signals at the first and second photodetector will therefore have the same amplitude profile of the probe signal as transmitted by the probe laser. As the travel time of the probe signal is known to a very high accuracy, the received signal and transmitted signal can be compared to determine the attenuation of each step of the probe signal. Assuming negligible transmission losses, the attenuation of each step of the probe signal is 0 dB such that the ratio of the received power to transmitted power of the probe signal is 100%.

In this example, the UE 7 emits an RF field in a single pulse (hereinafter, the "RF pulse"). For ease of explanation, it is assumed that the RF pulse propagates in all directions with a common path loss (in this example, inversely proportional to the square of the distance from the UE 7). This RF pulse will therefore pass through each HCF segment of the first and second optical fibers 10, 20, and (as explained above) will cause a change in transparency of the probe signal passing through that HCF segment at that time. As the attenuation of the probe signal due to the RF pulse is proportional to the signal strength of the RF pulse as it passes through the HCF segment, and the signal strength of the RF pulse is inversely proportional to the square of the distance travelled by the RF pulse, then the attenuation of the probe signal will be greater for HCF segments that are closer to the UE 7 compared to the attenuation of the probe signal for HCF segments that are further away from the UE 7.

To illustrate the effect in more detail, FIGS. 7a to 7c show a selection of three HCF segments (labelled A, B and C) of the first optical fiber (in which the probe signal propagates in a clockwise direction) and the UE 7 at first, second and third time instances following transmission of an RF pulse from the UE 7. FIG. 7d is a graph illustrating the ratio of the received power to the transmitted power of the probe signal as received at the first photodetector. The distance between the UE 7 and the HCF segment B is less than the distance between the UE 7 and HCF segment A, which is in turn less than the distance between the UE 7 and HCF segment C. Furthermore, the distance between HCF segments B and C (that is, along the first optical fiber 10) is greater than the distance between HCF segments A and B.

FIG. 7a illustrates the RF pulse at a first time instance (as illustrated by a dotted-line circle centered around the UE 7) in which the RF pulse is passing through the closest HCF segment, B, but has not yet reached HCF segments A and C. The RF pulse passes through HCF segment B and, during its passage, causes an attenuation of the strength of the probe signal passing through HCF segment B at that time. FIG. 7b illustrates the RF pulse at a second time instance, subsequent to the first time instance, in which the RF pulse has propagated further from the UE 7 such that it is beyond HCF segment B, is passing through HCF segment A but has not yet reached HCF segment C. The RF pulse passes through HCF segment A and, during its passage, causes an attenuation of the strength of the probe signal passing through HCF segment A at that time. FIG. 7c illustrates the RF pulse at a third time instance, subsequent to the second time instance, in which the RF pulse has propagated further from the UE 7 such that it is beyond HCF segments A and B and is now passing through HCF segment C. The RF pulse passes through HCF segment C and, during its passage, causes an attenuation of the strength of the probe signal passing through HCF segment C at that time. As the RF pulse is weaker during its passage of HCF segment C than during its passage of HCF segment A, and is weaker during its passage of HCF segment A than during its passage of HCF segment B (due to the relative distances and constant path loss), then the attenuation of the probe signal passing through HCF segment B during the passage of the RF pulse is greater than the attenuation of the probe signal passing through HCF segment A during the passage of the RF pulse, which is in turn greater than the attenuation of the probe signal passing through HCF segment C during the passage of the RF pulse. FIG. 7d illustrates the monitored signal at the first photodetector 70, which illustrates the ratio of the received probe signal to the transmitted signal, so as to indicate the strength of the attenuation of the probe signal against time. The first attenuation received at the first photodetector 70 is that of HCF segment C (which is closest to the first photodetector 70), the second attenuation received at the first photodetector 70 is that of HCF segment B, and the third attenuation received at the first photodetector 70 is that of HCF segment A. It is noted that the separation in time between these attenuations is a combination of both the time difference between the RF pulse arriving at the respective HCF segments and the time difference for the probe signal to traverse the first optical fiber 10 between the respective HCF segments. Furthermore, it is noted that the time difference between the RF pulse arriving at the respective HCF segments causes the attenuations to be either further apart or closer together than they would appear if the RF pulse passed through the HCF segments at the same time depending on whether the HCF segment that is subsequently affected by the RF pulse is closer to or further away from the first photodetector than the HCF segment that was previously affected by the RF pulse. In this example, the attenuation of the probe signal for HCF segment A appears further away from the attenuation of the probe signal for HCF segment B as HCF segment A is further away from the first photodetector 70 (and so the probe signal moves towards the first photodetector 70, and away from HCF segment A, in the time period between the first and second time instances), and the attenuation of the probe signal for HCF segment C appears closer to the attenuation of the probe signal for HCF segment B as HCF segment C is closer to the first photodetector 70 (and so the probe signal moves towards the first photodetector 70, and towards HCF segment C, in the time period between the first and third time instances).

In S3, the first and second photodetectors 70 monitor the probe signals passing along the first and second optical fibers 10, 20 respectively. Examples of the monitored probe signals in the first and second optical fibers are shown in FIG. 8a and FIG. 8b respectively, which illustrates the attenuations on all 64 HCF segments caused by the RF pulse.

Figure 8A:
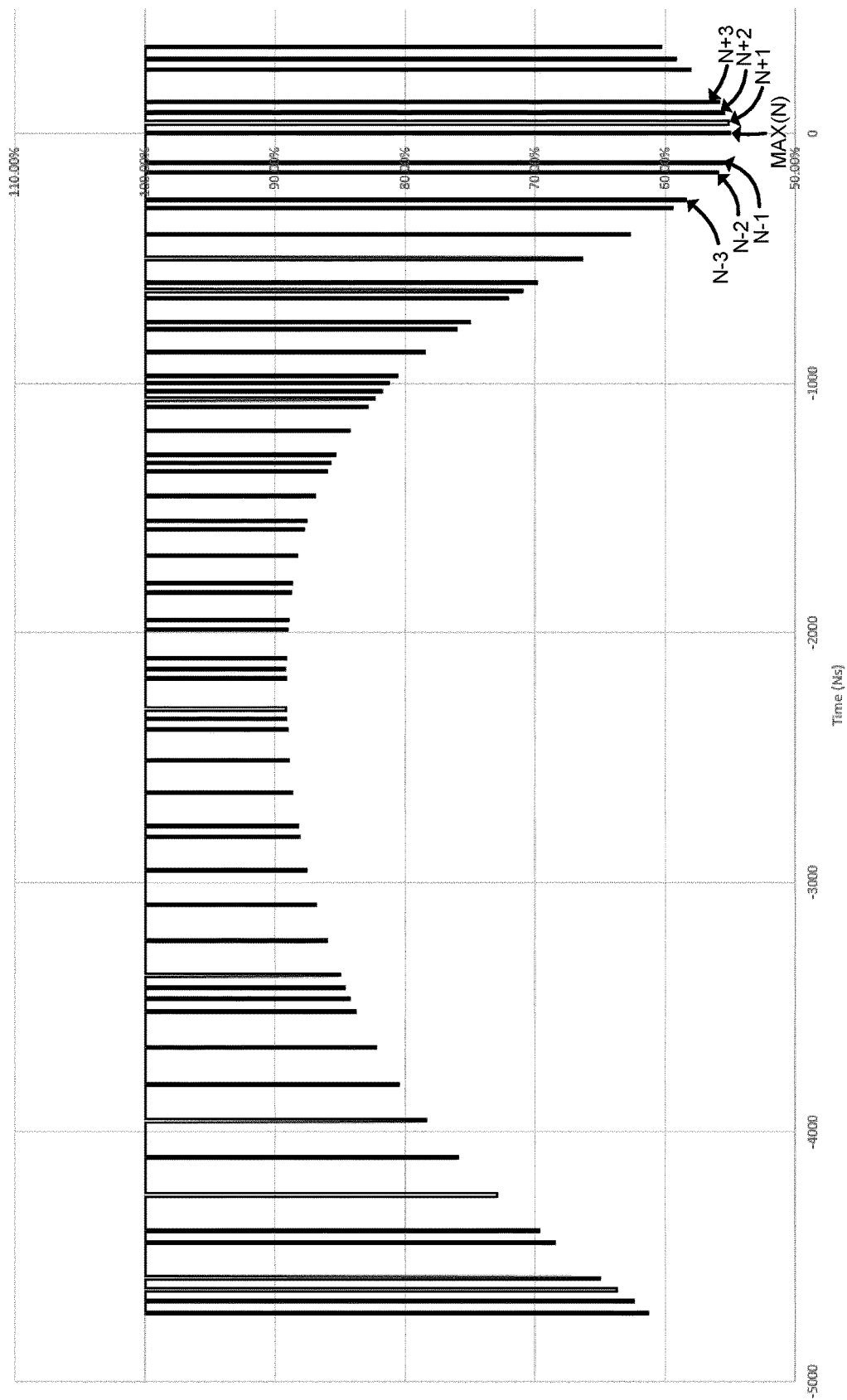
FIG. 8a is a graph illustrating the ratio of the received power to the transmitted power of a probe signal on a first optical fiber of the RF detector of FIG. 4, implementing the method of FIG. 5.
Figure 8B:
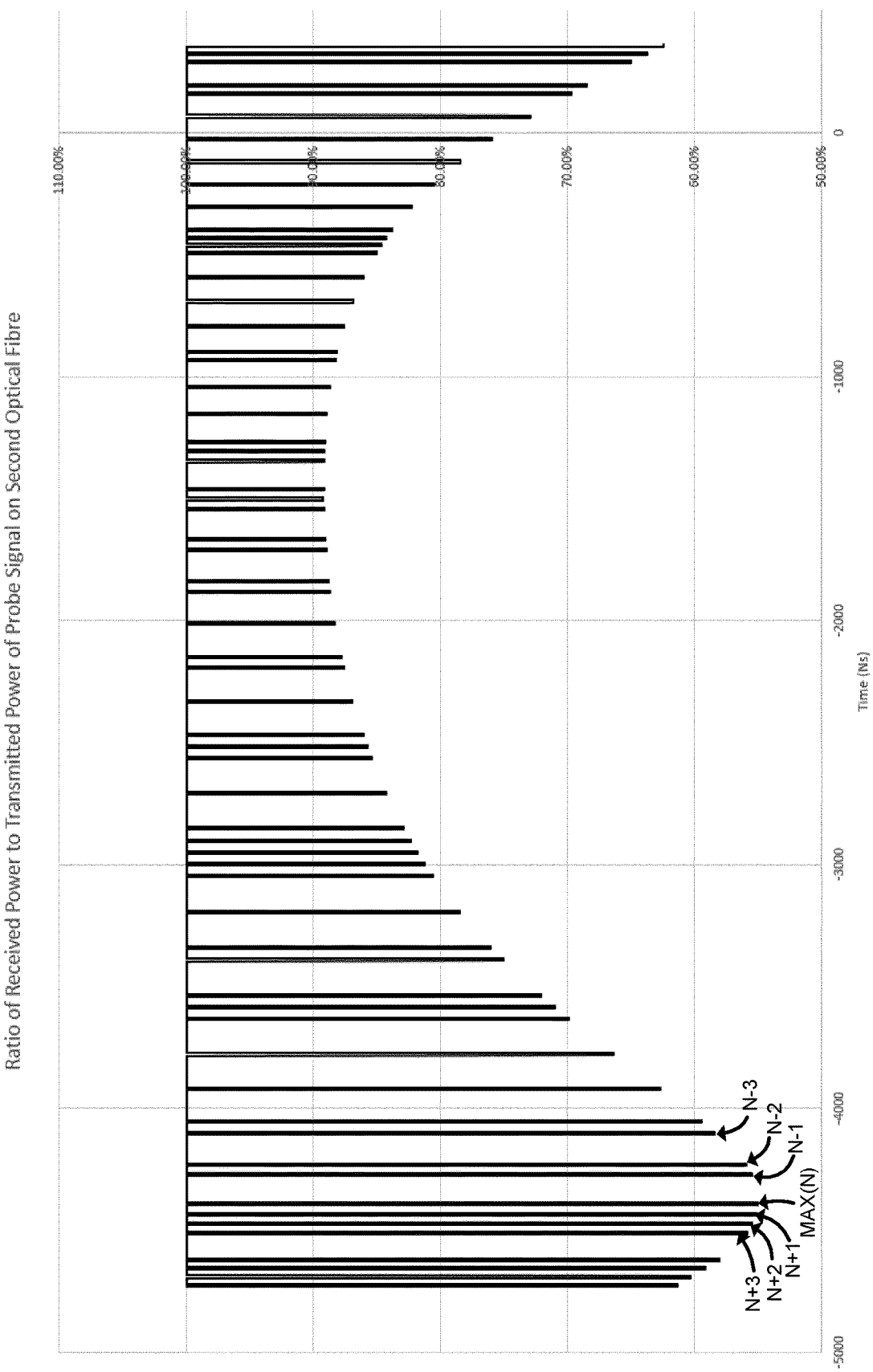
FIG. 8b is a graph illustrating the ratio of the received power to the transmitted power of a probe signal on a second optical fiber of the RF detector of FIG. 4, implementing the method of FIG. 5.

In S5, the greatest attenuation event in each monitored probe signal is identified (the greatest attenuation event is marked as "MAX" in FIGS. 8a and 8b for both the first and second optical fibers 10, 20). As discussed above, this greatest attenuation event corresponds to the attenuation caused on the probe signal passing through the HCF segment that is closest to the UE 7. The following is noted regarding terminology. The first optical fiber 10 has a clockwise probe signal, so that the attenuation events that are received at the first photodetector 70 in advance of the greatest attenuation event are associated with HCF segments that are in a "downstream" direction of the HCF segment associated with the greatest attenuation event, and the attenuation events that are received at the first photodetector 70 after the greatest attenuation event are associated with HCF segments that are in an "upstream" direction of the HCF segment associated with the greatest attenuation event. Applying this terminology to the example of FIGS. 7a to 7c, HCF segment C is downstream of HCF segment B, and HCF segment A is upstream of HCF segment B. The second optical fiber 20 has an counter-clockwise probe signal, so that the attenuation events that are received at the second photodetector 90 in advance of the greatest attenuation event are associated with HCF segments that are in a "downstream" direction of the HCF segment associated with the greatest attenuation event, and the attenuation events that are received at the second photodetector 90 after the greatest attenuation event are associated with HCF segments that are "upstream" of the HCF segment associated with the greatest attenuation event. Thus, the terms clockwise and counter-clockwise are used to describe the direction of the probe signals in the optical fibers, the term "upstream" is used to describe points along the optical fibers that are in an opposing direction to the probe signal's direction of travel along the optical fiber, and the term "downstream" is used to describe points along the optical fiber that are in the same direction of the probe signal's direction of travel along the optical fiber.

In S7, the base station 5 determines the reception time of the greatest attenuation event and the reception time of each of the three attenuation events immediately downstream of the greatest attenuation event and each of the three attenuation events immediately upstream of the greatest attenuation event. The base station 5 also records these time differences for the second optical fiber 20. The base station 5 then calculates the time difference between each attenuation event and its adjacent attenuation event. These attenuation events are illustrated in FIGS. 8a and 8b and the time differences (of this example) are illustrated in the table below.

TABLE 1

Table illustrating the received time of attenuation events either side of the greatest attenuation event in the first and second optical fibers 10, 20

| First Optical Fiber 10 | | | Second Optical Fiber 20 | | |
|---|---|---|---|---|---|
| Attenuation Event | Attenuation Event | Time Difference, ns | Attenuation Event | Attenuation Event | Time Difference, ns |
| N − 3 | N − 2 | 109.4 | N − 3 | N − 2 | 130.4 |
| N − 2 | N − 1 | 38.3 | N − 2 | N − 1 | 42.0 |
| N − 1 | MAX(N) | 117.2 | N − 1 | MAX(N) | 120.8 |
| MAX(N) | N + 1 | −41.7 | MAX(N) | N + 1 | −41.1 |
| N + 1 | N + 2 | −41.2 | N + 1 | N + 2 | −38.1 |
| N + 2 | N + 3 | −40.9 | N + 2 | N + 3 | −37.7 |

In S9, the base station 5 identifies the HCF segment associated with the greatest attenuation event (in other words, the HCF segment that is closest to the UE 7). This is achieved by, firstly, determining whether the time differences of attenuation events associated upstream and/or downstream HCF segments from the greatest attenuation event are useful data for this identification. This will be explained in more detail below in relation to the calibration phase, but, for the purposes of this embodiment, it is determined that the downstream attenuation events (N−3, N−2, N−1) for the first optical fiber 10 are not useful, the upstream attenuation events (N+1, N+2, N+3) for the first optical fiber 10 are useful, the upstream attenuation events (N−3, N−2, N−1) for the second optical fiber 20 are useful, and the downstream attenuation events (N+1, N+2, N+3) for the second optical fiber 20 are not useful. The useful data is highlighted by underlining in Table 1.

Secondly, it is determined whether the time difference between each two adjacent attenuation events are associated with either a long or short separation distance (i.e. long or short SMF segments separating two adjacent HCF segments associated with the two attenuation events). This is achieved by comparing the time difference to a classification threshold, which in this example is 90 ns. The classification threshold is determined in the calibration phase, discussed below.

In this example, the adjacent attenuation events are classified as shown in Table 2, below:

TABLE 2

Table illustrating the classifications of each attenuation event based on its time difference

| First Optical Fiber 10 | | | Second Optical Fiber 20 | | |
|---|---|---|---|---|---|
| Attenuation Event | Attenuation Event | Class | Attenuation Event | Attenuation Event | Class |
| N − 3 | N − 2 | N/A | N − 3 | N − 2 | Long |
| N − 2 | N − 1 | N/A | N − 2 | N − 1 | Short |
| N − 1 | MAX(N) | N/A | N − 1 | MAX(N) | Long |
| MAX(N) | N + 1 | Short | MAX(N) | N + 1 | N/A |
| N + 1 | N + 2 | Short | N + 1 | N + 2 | N/A |
| N + 2 | N + 3 | Short | N + 2 | N + 3 | N/A |

The time differences between each two adjacent attenuation events are based, in part, on the time it takes for the probe signal to travel between the HCF segments associated with each attenuation event (and thus the separation distance between these HCF segments). Thus, by manufacturing the optical fibers 10, 20 so that the spacing between a given HCF segment and its three upstream and three downstream HCF segments are unique to that HCF segment, these classifications can be used as a signature to identify the HCF segment associated with the greatest attenuation event. In the above example, the spacing classifications are long-short-long-short-short-short, or 101000 in binary. Thus, once this classification code has been determined, the classification code is compared to a lookup table to identify the corresponding HCF segment (this lookup table is again determined in the calibration phase). In this example, HCF segment 57 is identified as the HCF segment being associated with the greatest attenuation event and is therefore the closest HCF segment to the UE 7.

In 11, the distance between the closest HCF segment to the UE 7 and of at least two other HCF segments to the UE 7 are calculated as:

$$D_N = \frac{3*(AT_M - AT_N - T_{M,N})}{10*\sqrt{A_N}*\left(\frac{1}{\sqrt{A_M}} - \frac{1}{\sqrt{A_N}}\right)}$$

In which,
$D_N$ is the distance between a first HCF segment, N, and the UE 7,
$AT_N$ is the time an RF pulse (transmitted by the UE 7) attenuates a first HCF segment N,
$AT_M$ is the time the RF pulse attenuates a second HCF segment M,
$T_{M,N}$ is the time difference for an optical pulse to travel between the first HCF segment, N, and the second HCF segment, M,
$A_M$ is the magnitude of the attenuation event associated with the second HCF segment, M, and
$A_N$ is the magnitude of the attenuation event associated with the first HCF segment, N.

The above equation is derived from the following analysis. It is known that the RF pulse travels between the UE 7 and the first HCF segment, N, at the speed of light in free space:

$$c = \frac{D_N}{RFT_N} \approx 0.3 \text{ m/ns} \qquad (1)$$

Where $RFT_N$ is the arrival time of the RF pulse at the first HCF segment, N.

It is also assumed that there is a constant path loss for the RF pulse between the UE 7 and the first HCF segment, N:

$$A_N = \frac{P}{D_N^2} \qquad (2)$$

Where P is a constant and assumed to be equal among all HCF segments.

The time difference between the reception time of an attenuation event at the second HCF segment M and the reception time of an attenuation event at the first HCF segment N can be expressed as:

$$AT_M - AT_N = T_{M,N} RFT_M - RFT_N \qquad (3)$$

Rearranging equations (1) to (3), and assuming constant P is constant among all HCF segments, then the following solutions may be derived:

$$P = \left(\frac{3*(AT_M - AT_N - T_{M,N})}{10*\left(\frac{1}{\sqrt{A_M}} - \frac{1}{\sqrt{A_N}}\right)}\right)^2$$

$$D_N = \frac{3*(AT_M - AT_N - T_{M,N})}{10*\sqrt{A_N}*\left(\frac{1}{\sqrt{A_M}} - \frac{1}{\sqrt{A_N}}\right)}$$

$$RFT_N = \frac{AT_M - AT_N - T_{M,N}}{\sqrt{A_N}*\left(\frac{1}{\sqrt{A_M}} - \frac{1}{\sqrt{A_N}}\right)}$$

In S13, the location of the UE 7 is determined based on the distances between the UE 7 and several HCF segments, and the locations of each of those HCF segments, using known multilateration techniques.

The method of this first embodiment may be used to locate a UE 7 when the base station 5 is out of range of the UE. In the above example, the base station 5 and UE 7 are out of range as wireless transmissions from the UE 7 cannot be detected by the base station's antenna above the background noise. The skilled person will understand that base stations traditionally use dipole antennas for receiving signals from UEs. However, as Rydberg atom based RF detectors may be several orders of magnitude more sensitive than traditional antennae, then the Rydberg atom based RF detector may react to a low strength transmission from the UE 7 and be processed to locate the UE 7. Once the base station 5 has determined the location of the UE 7, this information may be used to improve connectivity between the base station 5 and UE 7. For example, the base station 5 may use this position information to transmit (or refine) a beam in the direction of the UE 7. Furthermore, the position may be determined at multiple time instances (by repeating the above method) in order to determine a direction of travel of the UE. This may be used to identify a base station whose coverage area will soon cover the UE, so as to enable a proactive transition mechanism or so that the base station and/or UE may configure in advance of the UE's arrival. The base station may therefore establish communications with the UE sooner than would otherwise be possible.

Figure 9:
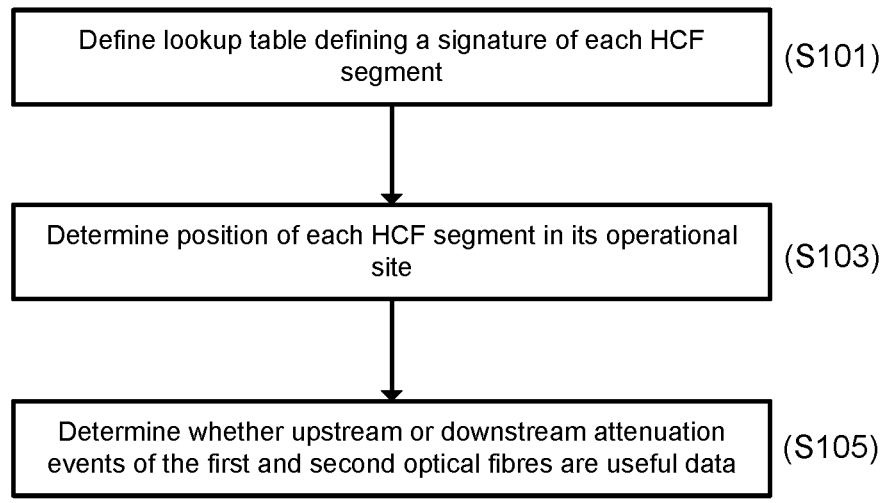
FIG. 9 is a flow diagram illustrating a calibration technique of the first embodiment of the method of the present disclosure.

A calibration technique will now be described with reference to FIGS. 9 and 10. This calibration technique is suitable for defining various parameters used in the first location determination process detailed above. The first and second optical fibers 10, 20 include 64 HCF segments separated by sections of SMF segments. The SMF segments may be classified as either 'long' or 'short' in length. In this embodiment, the first and second optical fibers 10, 20 are manufactured to have a ratio of three long separations for every one short separation. Furthermore, the optical fibers 10, 20 are manufactured so that the combination of lengths of three SMF segments to one side of a particular HCF segment and lengths of three SMF segments to the other side of that HCF segment is unique to that HCF segment. In the embodiment above, the combination of long-short-long-short-short-short uniquely identified HCF segment 57. Thus, in S101 of this calibration, a lookup table is defined during the optical fiber manufacture which defines a signature for each HCF segment of the optical fibers 10, 20.

Once manufactured, the optical fibers 10, 20 are deployed to their operational site. In S103, the position of each HCF segment of the optical fiber 10, 20 is determined. In this example, the position is determined using a GNSS receiver (e.g. during a drive test).

The lookup table from S101 and HCF segment locations from S103 are stored in memory on the base station 5.

In the location determination process detailed above, the base station 5 determines whether the upstream and downstream data for the first and second optical fibers is useful or not. In S105 of this calibration technique, this is determined in the following manner. First, a plurality of test RF pulses are transmitted, each from a unique test location and at a unique time (both location and time data are recorded for each test RF pulse). Second, the received probe signal is detected at the first and second photodetector for each test RF pulse. Similar to the first embodiment above, the greatest attenuation event is identified in each received probe signal and the time differences between adjacent attenuation events for three upstream adjacent attenuation event pairs and three downstream adjacent attenuation event pairs are calculated. As the location of the closest HCF segment is known (as the location of the test RF pulse is known), then the separation distances between HCF segments associated with these time differences can be identified.

This is performed for each test RF pulse, resulting in a dataset correlating (for both the clockwise and counter-clockwise probe signals and for both upstream and downstream HCF segments) short separation distances with a set of time differences and long separation distances with another set of time differences. This dataset is illustrated in the histograms of FIG. 10, showing the density of time differences for both short and long separation distances for upstream HCF segments in the clockwise probe signal of the first optical fiber 10, the density of time differences for both short and long separation distances for downstream HCF segments in the clockwise probe signal of the first optical fiber 10, the density of time differences for both short and long separation distances for upstream HCF segments in the counter-clockwise probe signal in the second optical fiber 20, and the density of time differences for both short and long separation distances for downstream HCF segments in the counter-clockwise probe signal of the second optical fiber 20. It can be seen that there is an overlap in the time differences associated with short and long separation distances of downstream HCF segments for the counter-clockwise probe signal and of downstream HCF segments for the clockwise probe signal. This indicates that such data from downstream HCF segments for the counter-clockwise probe signal and from downstream HCF segments for the counter-clockwise probe signal is not useful in the method of the first embodiment, as (when the location of the RF pulse is not known) then one cannot reliably classify time differences as being associated with long or short separation distances. However, the histograms also illustrate that data from upstream HCF segments for the clockwise probe signal and from upstream HCF segments for the counter-clockwise probe signal are useful in the method of the first embodiment, as there is a clear difference (i.e. no overlap) between time differences associated with short and long separation distances. These histograms can also be used to identify a suitable time difference classification threshold to be used in the first embodiment. This may be any time difference between the longest time difference associated with short SMF segments and the shortest time difference associated with long SMF segments, or more preferably may be at or near halfway between these two extremes.

Figure 11:
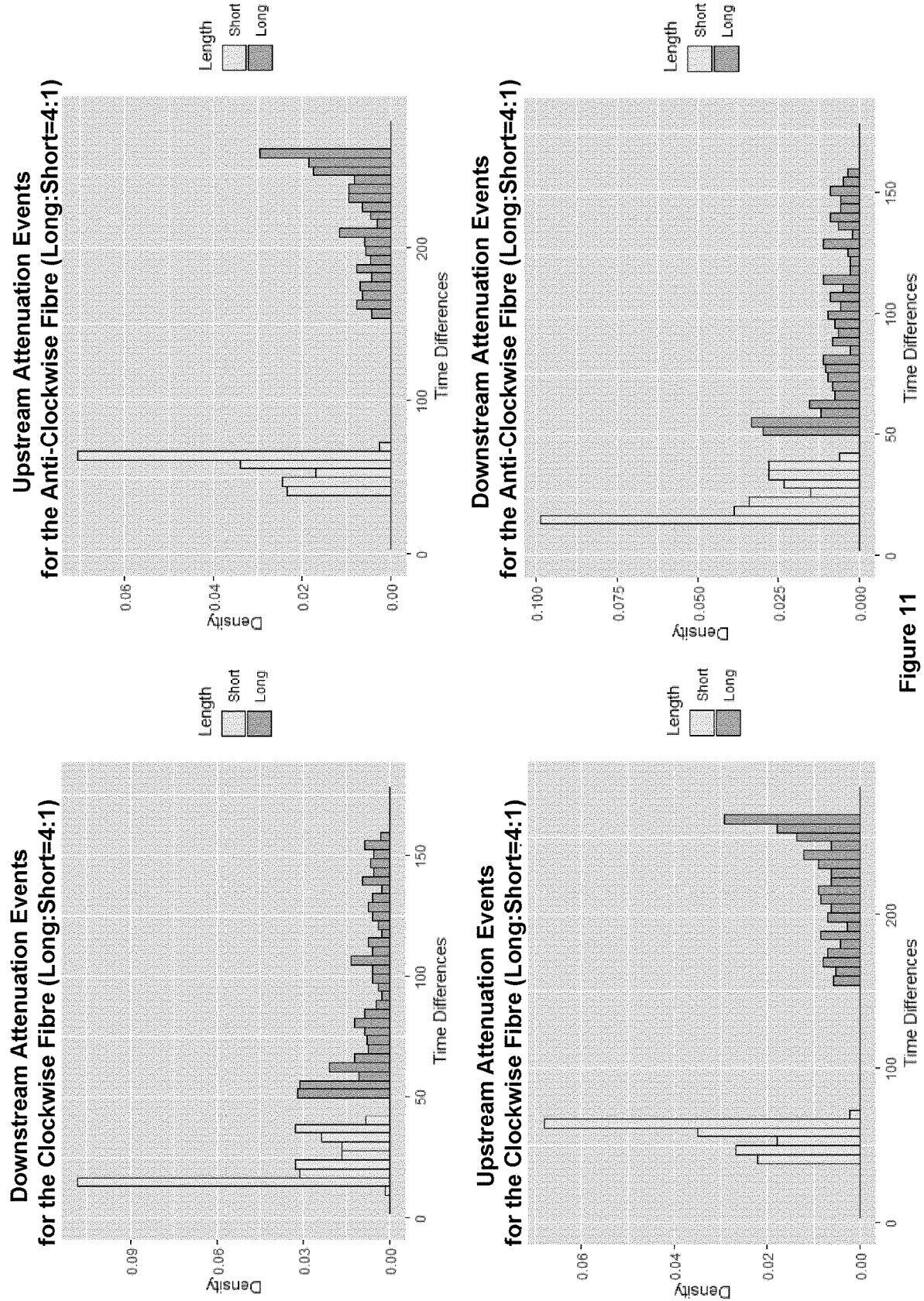
FIG. 11 includes four histograms illustrating the frequency of time differences between adjacent attenuation events for a first alternative optical fiber and second alternative optical fiber for both downstream and upstream attenuation events.

The above calibration technique to determine whether to use the upstream or downstream data is non-essential. Depending on the particular deployment of HCF segments about the optical fiber, the upstream and downstream of one or both optical fibers may become useful for the purposes of the first embodiment above. FIG. 11 includes four histograms illustrating the density of time differences for long and short separation distances in alternative optical fibers for both clockwise and counter-clockwise probe signals. These alternative optical fibers use a ratio of four long separation distances to every one short separation distance (in contrast to the three to one ratio used in the first embodiment). It can be seen that there are gaps between the short and long classifications for each histogram, illustrating that upstream and downstream data for both optical fibers may be used. Furthermore, the skilled person will also realize that the invention may be practiced using a single optical fiber, as the upstream data and downstream data for that single optical fiber are both useful (the second optical fiber may then optionally be deployed for consistency checks or for improved accuracy).

In the above embodiment, the time differences between three attenuation event pairs either side of the greatest attenuation event were correlated with the lookup table of separation distances between HCF segments in order to determine the identity of the HCF segment associated with the greatest attenuation event. This technique can be advantageous as these attenuation events have a greater signal to noise ratio over the background noise, reducing the error in the subsequent calculations. However, the skilled person will understand that this is non-essential. This may be illustrated by a further example, in which the optical fiber is manufactured so that the combination of separation distances for each HCF segment and the (say) 5th HCF segment on one side of that HCF segment and the (say) 4th HCF segment on the opposing side of that HCF segment is unique to that HCF segment, and the lookup table is defined to indicate the unique combination of separation distances between each HCF segment (N) and these other HCF segments (N−5, N+4). The probe signal may then be analyzed to identify the time difference between the greatest attenuation event and the 5th attenuation event on one side of the greatest attenuation event, and the time difference between the greatest attenuation event and the 4th attenuation event on the other side of the greatest attenuation event, and match these time differences to the lookup table to identify the HCF segment associated with the greatest attenuation event. The optical fiber should therefore be manufactured so that each HCF segment has a unique combination of separation distances with several other HCF segments, these other HCF segments having a particular sequence relationship to that HCF segment. It is also non-essential that the sequence relationship to other HCF segments is to HCF segments either side of a particular HCF segment. Thus, in a further example, the optical fiber may be manufactured so that the combination of separation distances for each HCF segment and the (say) 5th HCF segment on one side of that HCF segment and the (say) 4th HCF segment on the same side of that HCF segment is unique to that HCF segment. Generally speaking, the optical fiber should therefore be manufactured so that each HCF segment within the sequence of HCF segments: has a first separation distance to a first other HCF segment being a particular number of HCF segments preceding or succeeding in the sequence, has a second separation distance to a second other HCF segment being a particular number of HCF segments preceding or succeeding in the sequence, and is uniquely identified by the first and second separation distances.

Furthermore, it is also non-essential that these time differences are based upon the greatest attenuation event. That is, the time differences between any attenuation event and the other attenuation events (having the particular sequence relationship) may be used in the correlation to the lookup table in order to identify the HCF segment associated with that attenuation event. However, as noted above, it is beneficial to use the greatest attenuation event as it would most likely have the greatest signal to noise ratio.

In the above embodiment, the HCF segments contain an atomic medium based on Rubidium-85 which may experience the EIT effect and have Rydberg states having energy differences that correlate with the photonic energy of frequencies used in wireless telecommunication protocols. The RF detector may therefore be configured to detect RF waves of a particular frequency by setting the coupling frequency to excite electrons to a particular Rydberg state, wherein the energy difference between that Rydberg state and the next Rydberg state matches the photonic energy of the RF wave to be detected. The skilled person will therefore understand that the use of Rubidium-85 is non-essential, and any atomic medium that may react to an RF wave so as to vary its transparency to the probe signal may be used in the above embodiment. The RF detector therefore does not need to be an end-to-end optical fiber, but may be any waveguide with interleaved optical fiber sections and variable transparency sections. Furthermore, it is also non-essential that the sections of optical fiber between the variable transparency sections are made of SMF (for example, multi-mode fiber may be used instead, or indeed any other waveguide).

It is also non-essential that the detector is configured to detect electromagnetic fields in the RF band of the electromagnetic spectrum. That is, the detector may be configured so that the variable transparency section varies it transparency in response to incident electromagnetic fields of other parts of the spectrum (e.g. by using an atomic medium with particular energy states and by selecting an appropriate coupling frequency, as described above). The method of the above embodiment may therefore be used as an electromagnetic field detector.

In the above embodiment, a ladder scheme EIT effect was used in the Rydberg atom based RF detector. However, the skilled person will understand that any other form of EIT effect may be used, such as lambda or vee.

Furthermore, it is non-essential that the probe and coupling signals are split for transmission along the first and second optical fiber. In an alternative arrangement, several probe lasers and several coupling lasers may be used to transmit the corresponding probe and coupling signals onto the first and second optical fibers respectively. It is also non-essential to use two separate lasers in which a first laser emits the probe signal and a second laser emits the coupling signal. That is, a single laser could be configured to emit the two separate signals (e.g. using a grating). Furthermore, it is non-essential for the probe and coupling signals to be counter-propagating. However, this can be advantageous as the Doppler shift effect may be ignored.

The skilled person will also understand that it is non-essential that the method is performed by the base station. The method may be performed by one or more suitable computing devices.

Insofar as embodiments of the disclosure described are implementable, at least in part, using a software-controlled programmable processing device, such as a microprocessor, digital signal processor or other processing device, data processing apparatus or system, it will be appreciated that a computer program for configuring a programmable device, apparatus or system to implement the foregoing described methods is envisaged as an aspect of the present disclosure. The computer program may be embodied as source code or undergo compilation for implementation on a processing device, apparatus or system or may be embodied as object code, for example.

Suitably, the computer program is stored on a carrier medium in machine or device readable form, for example in solid-state memory, magnetic memory such as disk or tape, optically or magneto-optically readable memory such as compact disk or digital versatile disk etc., and the processing device utilizes the program or a part thereof to configure it for operation. The computer program may be supplied from a remote source embodied in a communications medium such as an electronic signal, radio frequency carrier wave or optical carrier wave. Such carrier media are also envisaged as aspects of the present disclosure.

It will be understood by those skilled in the art that, although the present invention has been described in relation to the above described example embodiments, the invention is not limited thereto and that there are many possible variations and modifications which fall within the scope of the invention.

The skilled person will understand that any combination of features is possible within the scope of the invention, as claimed.

The invention claimed is:

1. A device comprising:
    a sequence of variable transparency segments, wherein each variable transparency segment of the sequence of variable transparency segments is configured to vary a transparency by the Electromagnetically Induced Transparency (EIT) effect and further vary the transparency in response to an incident electromagnetic field; and
    a plurality of separator segments interspersed within the sequence of variable transparency segments so that each variable transparency segment:
        has a first separation distance from a first other variable transparency segment being a first predetermined number of variable transparency segments preceding or succeeding in the sequence of variable transparency segments,
        has a second separation distance from a second other variable transparency segment being a second predetermined number of variable transparency segments preceding or succeeding in the sequence of variable transparency segments, and
        is uniquely identified by a combination of separation distances comprising the respective first separation distance and second separation distance.

2. The device as claimed in claim 1, wherein the first other variable transparency segment is preceding in the sequence of variable transparency segments and the second other variable transparency segment is succeeding in the sequence of variable transparency segments.

3. The device as claimed in claim 2, wherein the first other variable transparency segment is immediately preceding in the sequence of variable transparency segments and the second other variable transparency segment is immediately succeeding in the sequence of variable transparency segments.

4. The device as claimed in claim 1, wherein at least one of the first separation distance or the second separation distance is a classification in either a first distance category or a second distance category.

5. The device as claimed in claim 1, wherein each variable transparency segment includes a metal vapor.

6. The device as claimed in claim 5, wherein the metal vapor is of an alkali metal.

7. The device as claimed in claim 6, wherein the alkali metal vapor is one of Rubidium, Cesium or Strontium.

8. The device as claimed in claim 1, wherein the electromagnetic field is a Radio Frequency (RF) field.

9. A system comprising the first device and the second device as claimed in claim 1, wherein corresponding variable transparency segments of the sequence of variable transparency segments of the first device and the second device are collocated such that a separation distance between each pair of variable transparency segments in the first device is the same as a separation distance between each corresponding pair of variable transparency segments in the second device.

10. An electromagnetic field detector comprising:
a first optical transmitter;
a first optical receivers; and
the first device as claimed in claim 1, wherein:
the first optical transmitter and the first optical receiver terminate opposing ends of the first device, and
the first optical transmitter is configured to:
transmit a probe signal to the first optical receiver via the first device at a probe frequency, wherein the probe frequency is set to excite electrons of each variable transparency segment of the first device from a first state to a second state, and
transmit a coupling signal via the first device at a coupling frequency, wherein the coupling frequency is set to excite electrons of each variable transparency segment of the first device to a predetermined state so as to vary the transparency of each variable transparency segment to the probe signal by the EIT effect and so that an electromagnetic field incident at each variable transparency segment of the first device further varies the transparency of the probe signal at that variable transparency segment so as to cause a detectable change in power of the probe signal at the first optical receiver.

11. The electromagnetic field detector as claimed in claim 10, further comprising:
a second optical transmitter;
a second optical receiver; and
the second device, wherein:
corresponding variable transparency segments of the sequence of variable transparency segments of the first device and the second device are collocated such that the separation distance between each pair of variable transparency segments in the first device is the same as the separation distance between each corresponding pair of variable transparency segments in the second device,
the second optical transmitter and the second optical receiver terminate opposing ends of the second device, and
the second optical transmitter is configured to:
transmit a second probe signal via the second device at the probe frequency, and
transmit a second coupling signal via the second device at the coupling frequency so as to vary the transparency of each variable transparency segment of the second device to the probe signal by the EIT effect and so that an electromagnetic field incident at each variable transparency segment of the second device further varies the transparency of the probe signal at that variable transparency segment so as to cause a detectable change in power of the probe signal at the second optical receiver.

12. The electromagnetic field detector as claimed in claim 10, wherein the electromagnetic field is a Radio Frequency (RF) field.

13. The electromagnetic field detector as claimed in claim 11, wherein the first optical transmitter is also the second optical transmitter.

14. The electromagnetic field detector as claimed in claim 11, wherein the first optical receiver is also the second optical receiver.

15. A method of operating an electromagnetic field detector, the electromagnetic field detector comprising the first device as claimed in claim 1, the method comprising:
transmitting a first probe signal along the first device at a probe frequency and at a first transmission power value, wherein the probe frequency is set to excite electrons of each variable transparency segment of the first device from a first state to a second state;
transmitting a coupling signal along the first device at a coupling frequency, wherein the coupling frequency is set to excite electrons of each variable transparency segment of the first device to a predetermined state so as to vary the transparency of each variable transparency segment of the first device to the first probe signal by the EIT, effect and so that an electromagnetic field incident at each variable transparency segment of the first device further varies the transparency of the first probe signal at that variable transparency segment so as to cause a detectable change in power of the first probe signal;
monitoring the first probe signal;
detecting, within the monitored first probe signal, a first plurality of attenuation events, wherein each attenuation event of the first plurality of attenuation events is identifiable as a reduction in the power of the monitored first probe signal relative to the first transmission power value and each attenuation event of the first plurality of attenuation events is associated with a reception time;
correlating reception times of each attenuation event of the first plurality of attenuation events with the unique combination of separation distances to associate each of the first plurality of attenuation events with a variable transparency segment of the first device;
for a subset of the associated variable transparency segments, determining a distance between each associated variable transparency segment and a transmitter of the electromagnetic field; and determining a location of the transmitter based on the determined distances between each associated variable transparency segment and the transmitter.

16. The method as claimed in claim 15, wherein the electromagnetic field detector further comprises the second device, wherein corresponding variable transparency segments of the sequence of variable transparency segments of the first device and the second device are collocated such that a separation distance between each pair of variable transparency segments in the first device is the same as a separation distance between each corresponding pair of variable transparency segments in the second device, the method further comprising:

transmitting a second probe signal along the second device at the probe frequency and at a second transmission power value;

transmitting a second coupling signal along the second device at the coupling frequency;

monitoring the second probe signal; and detecting, within the monitored second probe signal, a second plurality of attenuation events, wherein each attenuation event of the second plurality of attenuation events is identifiable as a reduction in a power of the monitored second probe signal relative to the second transmission power value and each attenuation event of the second plurality of attenuation events is associated with a reception time, wherein the correlating includes correlating the reception times of attenuation events from either the first plurality of attenuation events or the second plurality of attenuation events with the unique combination of separation distances to associate each of the first plurality of attenuation events or the second plurality of attenuation events with a variable transparency segment of the first device or the second device.

17. The method as claimed in claim 16, wherein the first probe signal and the second probe signal are transmitted in opposing directions.

18. The method as claimed in claim 16, further comprising:

transmitting a first calibration probe signal along the first device at the probe frequency and at a first calibration transmission power value;

transmitting a second calibration probe signal along the second device at the probe frequency and at a second calibration transmission power value;

transmitting a first calibration coupling signal along the first device at the coupling frequency;

transmitting a second calibration coupling signal along the second device at the coupling frequency;

transmitting a plurality of calibration electromagnetic waves, each from a known location, wherein each calibration electromagnetic wave of the plurality of calibration electromagnetic waves incident at each variable transparency segment of the first device and the second device varies a transparency of the calibration probe signal at that variable transparency segment so as to cause a detectable change in a power of the calibration probe signal;

monitoring the first calibration probe signal and the second calibration probe signal;

detecting, within the monitored first calibration probe signal and second calibration probe signal, a first plurality of calibration attenuation events and a second plurality of calibration attenuation events respectively, wherein each calibration attenuation event of the first plurality of calibration attenuation events is identifiable as a reduction in the power of the monitored first calibration probe signal relative to the first calibration transmission power value and each calibration attenuation event of the first plurality of calibration attenuation events is associated with a reception time, and each calibration attenuation event of the second plurality of calibration attenuation events is identifiable as a reduction in the power of the monitored second calibration probe signal relative to the second calibration transmission power value and each calibration attenuation event of the second plurality of calibration attenuation events is associated with a reception time; and determining whether an attenuation event of the first plurality of attenuation events of the first monitored probe signal or the second plurality of attenuation events of the second monitored probe signal should be used in the correlating based on the reception times of the first plurality of calibration attenuation events of the monitored first calibration probe signal and the reception times of the second plurality of calibration attenuation events of the monitored second calibration probe signal.

19. The method as claimed in claim 15, wherein the electromagnetic field is a Radio Frequency (RF) field.

20. A non-transitory computer-readable storage medium storing a computer program product comprising instructions which, when the instructions are executed by a computer, cause the computer to carry out the method of claim 15.

* * * * *

UNITED STATES PATENT AND TRADEMARK OFFICE
CERTIFICATE OF CORRECTION

PATENT NO. : 11,835,564 B2
APPLICATION NO. : 17/754871
DATED : December 5, 2023
INVENTOR(S) : Fraser Burton et al.

Page 1 of 1

It is certified that error appears in the above-identified patent and that said Letters Patent is hereby corrected as shown below:

On the Title Page

In item (87), in Column 1, in "PCT Pub. No.", Line 1, delete "WO2021/078434" and insert -- WO2021/078438 --.

In the Specification

In Column 14, Line 17, delete "$AT_M–AT_N=T_{M,N}RFT_M–RFT_N$" and insert -- $AT_M–AT_N=T_{M,N}+RFT_M–RFT_N$ --.

In the Claims

In Column 20, Line 44, in Claim 15, delete "EIT, effect" and insert -- EIT effect --.

Signed and Sealed this
Fourteenth Day of May, 2024

Katherine Kelly Vidal
*Director of the United States Patent and Trademark Office*